United States Patent
Zhang et al.

(10) Patent No.: US 12,068,849 B2
(45) Date of Patent: Aug. 20, 2024

(54) DATA TRANSMISSION METHOD AND APPARATUS

(71) Applicant: Huawei Technologies Co., Ltd., Shenzhen (CN)

(72) Inventors: Lei Zhang, Shenzhen (CN); Lei Wang, Shanghai (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 18/175,302

(22) Filed: Feb. 27, 2023

(65) Prior Publication Data

US 2023/0208556 A1 Jun. 29, 2023

Related U.S. Application Data

(63) Continuation of application No. PCT/CN2021/110033, filed on Aug. 2, 2021.

(30) Foreign Application Priority Data

Aug. 28, 2020 (CN) .......................... 202010887526.1

(51) Int. Cl.
H04L 1/00 (2006.01)

(52) U.S. Cl.
CPC .......... *H04L 1/0057* (2013.01); *H04L 1/0042* (2013.01)

(58) Field of Classification Search
CPC ... H04L 1/0057; H04L 1/0042; H04L 5/0051; H04J 13/12; H03M 13/35; H03M 13/136; H04W 72/044; H04W 28/06
USPC .......................................................... 375/295
See application file for complete search history.

(56) References Cited

U.S. PATENT DOCUMENTS

| 2018/0145797 A1* | 5/2018 | Yeo ........................ H04L 1/1812 |
| 2018/0167946 A1* | 6/2018 | Si .......................... H04W 72/30 |

FOREIGN PATENT DOCUMENTS

| EP | 3454496 A1 | 3/2019 |
| WO | 2020052646 A1 | 3/2020 |

OTHER PUBLICATIONS

Pei Yang et al., "Massive Access in Multi-cell Wireless Networks Using Reed-Muller Codes," Mar. 25, 2020, total: 4 pages.

* cited by examiner

*Primary Examiner* — Fitwi Y Hailegiorgis
(74) *Attorney, Agent, or Firm* — Slater Matsil, LLP

(57) ABSTRACT

A data transmission method and apparatus are disclosed. The method includes a first communication apparatus obtains information bit information of an ith sub-block, where the information bit information of the ith sub-block includes information bits of the ith sub-block and an information bit length of the ith sub-block, and i is a positive integer; obtains a matrix order M of the RM corresponding to the first communication apparatus in the ith sub-block, where M is a positive integer; then obtains, based on M, a first P matrix and a first b vector that are used to generate an RM; then generates, based on the first P matrix and the first b vector, the RM sequence corresponding to the ith sub-block; and finally, outputs the RM sequence corresponding to the ith sub-block.

20 Claims, 10 Drawing Sheets

DATA TRANSMISSION METHOD AND APPARATUS

CROSS-REFERENCE TO RELATED APPLICATIONS

This application is a continuation of International Application No. PCT/CN2021/110033, filed on Aug. 2, 2021, which claims priority to Chinese Patent Application No. 202010887526.1, filed on Aug. 28, 2020. The disclosures of the aforementioned applications are hereby incorporated by reference in their entireties.

TECHNICAL FIELD

This application relates to the communication field, and in particular, to a data transmission method and an apparatus.

BACKGROUND

New Radio Access Technology (NR) is a popular standard for cellular communication networks, covering three scenarios: enhanced Mobile Broadband (eMBB), ultra-Reliable Low Latency Communications (uRLLC), and massive Machine Type Communication (mMTC). An eMBB scenario emphasizes a high throughput, a uRLLC scenario emphasizes high reliability and a low latency, and an mMTC scenario emphasizes a large quantity of connections. In the mMTC scenario, there are a large quantity of potential to-be-accessed users in a cell. These users may be mobile phones, or may be devices in the Internet of Things. Although data packets sent by these users each time are relatively small, because there are a large quantity of users, access performance and data transmission performance of a network are severely challenged. Allocating an uplink resource to each user by a base station brings very high signaling overheads. Designing a grant free access system is an inevitable choice in the future and has important practical significance. The grant free transmission may be understood as contention-based uplink service data transmission. For uplink communication, a network device needs to configure different demodulation reference signals (DMRS) or preambles for different terminals. The network device identifies a user and performs channel estimation by receiving a reference signal of a user equipment (UE). A bottleneck problem of grant free access is a quantity of reference signals, and a quantity of reference signals supported by an existing NR protocol is very limited. Because there are too many UEs, an insufficient quantity of available reference signals is a bottleneck of a network capacity. To resolve this problem, RM (Reed Muller) codes are proposed. An RM code is a very important linear block code, which has the advantages of simple construction, rich structure characteristics, and a reachable erasure channel capacity. Due to these advantages, RM codes are widely applied in the industry, for example, applied to a deep space communication system (such as Mars exploration) and a cellular communication system (such as Long Term Evolution (LTE)). The design of reference signal based on RM codes can make full use of the advantages of "ultra-large sequence space" and "extremely low complexity".

Currently, a large-capacity reference signal design solution has been provided, and problems of a quantity of reference signals and detection complexity are resolved by using a method in the field of compressed sensing. In this solution, the communication apparatus stores a fixed RM codebook set, and then generates, through calculation based on each RM sequence in the codebook set, a reference signal used to mark the UE. In this way, a large quantity of reference signals can be provided to mark a large quantity of potential users, and low-complexity user detection and channel estimation can be implemented.

When the solution is applied to an unsourced transmission process, to meet a fast RM detection algorithm, if the foregoing solution is used, the terminal needs to store a large quantity of RM codebook sets. In this case, storage overheads of the communication apparatus are relatively high.

SUMMARY

Embodiments of this application provide a data transmission method and an apparatus, to dynamically determine, in an unsourced transmission process, a codebook set corresponding to each sub-block, so as to reduce storage overheads of a communication apparatus.

According to a first aspect, an embodiment of this application provides a data transmission method, specifically including: when a first communication apparatus prepares to transmit data, the first communication apparatus obtains information bit information of an ith sub-block, where the information bit information of the ith sub-block includes information bits of the ith sub-block and an information bit length of the ith sub-block, and i is a positive integer; in addition, the first communication apparatus obtains a matrix order M of the RM corresponding to the first communication apparatus in the ith sub-block, where M is a positive integer; then the first communication apparatus obtains, based on M, a first P matrix and a first b vector that are used to generate an RM; then the first communication apparatus generates, based on the first P matrix and the first b vector, the RM sequence corresponding to the ith sub-block; and finally, the first communication apparatus outputs the RM sequence corresponding to the ith sub-block.

In this embodiment, the first communication apparatus may be a mobile phone, a tablet computer, a relay station, or another device that may perform communication. A specific case is not limited herein.

The RM sequence is generated by using the P matrix and the b vector based on a generation formula, where the generation formula may be:

$$\phi_{P,b}(j) = A * i^{(2b+Pa_{j-1})^T a_{j-1}};$$

where $\phi_{P,b}(j)$ is a value of a jth element in the second-order RM sequence, A is an amplitude normalization factor, $i^2 = -1$, P is a binary symmetric matrix with M rows and M columns, b is a binary vector with a length of M, and $a_{j-1}$ is a binary vector with a length of M, which is converted from an integer value j−1. It can be seen from the generation formula of the RM sequence that, for each fixed P matrix (which may be compared to a root of a ZC (Zadoff-Chu) sequence), changing a value of the b vector may generate space of 2 to the power of N orthogonal RM sequences. RM sequences constructed using different P matrices are non-orthogonal. It may be understood that the binary symmetric matrix in this embodiment is a symmetric matrix formed by only two types of elements: 0 and 1, and the binary vector is a vector value formed by only two types of elements: 0 and 1.

In this embodiment, although the P matrix and the b vector are used in the RM sequence generation formula to name the matrix and the vector that are used to generate the RM sequence, the P matrix and the b vector are merely example descriptions. Actually, the matrix and the vector that are used to generate the RM sequence may be named in another manner. Therefore, the P-matrix set and the b-vector set in this embodiment are merely example descriptions, and another naming manner may also be used. This is not limited herein.

In this embodiment, the first communication apparatus generates a corresponding RM codebook set for each sub-block in a data transmission process, and no longer uses a fixed codebook set, thereby reducing storage overheads of the first communication apparatus.

Optionally, that the first communication apparatus determines the first P matrix and the first b vector based on M and the information bit information of the ith sub-block includes the first communication apparatus obtains a P-matrix set and a b-vector set based on M; and the first communication apparatus determines the first P matrix from the P-matrix set based on the information bit information of the ith sub-block, and determines the first b vector from the b-vector set.

In this embodiment, a specific manner in which the first communication apparatus obtains the P-matrix set and the b-vector set based on M may include the following several possible implementations.

In a possible implementation, the first communication apparatus generates a size of the P-matrix set and a size of the b-vector set based on M and the information bit length of the ith sub-block; and then the first communication apparatus generates the P-matrix set based on M, the size of the P-matrix set, an information bit set, and the first communication apparatus generates the b-vector set based on M, the b-vector set, and the information bit set, where the information bit set includes information bits of at least one of the first sub-block to the ith sub-block. This solution is applied to a case in which no check bit is added to the ith sub-block. In this way, codebook sets of different sub-blocks of a same UE have a cascading constraint relationship, thereby improving detection reliability.

Based on the foregoing solution, a specific operation of generating, by the first communication apparatus, the size of the P-matrix set and the size of the b-vector set based on M and the information bit length of the ith sub-block may be as follows. When the information bit length of the ith sub-block is greater than or equal to M, the size of the P-matrix set is determined by a difference between the information bit length of the ith sub-block and M, and the size of the b-vector set is determined by M; or when the information bit length of the ith sub-block is less than M, the size of the P-matrix set is 1, and the size of the b-vector set is determined by the information bit length of the ith sub-block. In an example solution, the size of the P-matrix set and the size of the b-vector set may meet the following formula:

When $B_i \geq M$, $S_{b,i}=2^M$, and $S_{P,i}=2^{B_i-M}$; or when $B_i < M$, $S_{b,i}=2^{B_i}$, and $S_{P,i}=2^0=1$;

where $B_i$ is used to indicate the information bit length of the ith sub-block, M is used to indicate an order of a binary symmetric matrix of an RM sequence, $S_{b,i}$ is used to indicate the size of the b-vector set, and $S_{P,i}$ is used to indicate the size of the P-matrix set. In this embodiment, when the information bit length of the ith sub-block is equal to M, a manner of determining the size of the P-matrix set and the size of the b-vector set is as follows: In a possible implementation, the size of the P-matrix set may be determined based on a difference between the information bit length of the ith sub-block and M, and the size of the b-vector set is determined by M. In another implementation, the size of the P-matrix set is 1, and the size of the b-vector set is determined by the information bit length of the ith sub-block.

That is, when the information bit length of the ith sub-block is equal to M, any possible implementation may be selected according to an actual situation to calculate the size of the P-matrix set and the size of the b-vector set.

Determining the size of the P-matrix set and the size of the b-vector set by using the foregoing solution can ensure a relatively low cross-correlation between sequences in an RM sequence codebook that is finally generated by using an RM sequence generation formula.

In another possible implementation, the first communication apparatus generates a size of the P-matrix set and a size of the b-vector set based on M and a length of encoded information bits of the ith sub-block, where the length of the encoded information bits of the ith sub-block is a sum of a length of check bits after the check bits are added to the ith sub-block and the information bit length of the ith sub-block; and then the first communication apparatus generates the P-matrix set based on M, the size of the P-matrix set, the information bit set, and the first communication apparatus generates the b-vector set based on M, the b-vector set, and the information bit set. Based on this solution, the information bit set includes information bits of at least one of the first sub-block to the ith sub-block; or the information bit set includes at least one of encoded information bits of the first sub-block to encoded information bits of the ith sub-block, and the encoded information bits include check bits and information bits of the sub-block. The check bits are generated according to a rule such as a convolutional code or a Hamming code. In this way, check bits are added, and codebook sets of different sub-blocks of a same UE have a cascading constraint relationship, so that detection reliability can be further improved.

Based on the foregoing solution, a specific operation of generating, by the first communication apparatus, the size of the P-matrix set and the size of the b-vector set based on M and the length of the encoded information bits of the ith sub-block may be as follows.

When the length of the encoded information bits of the ith sub-block is greater than M, the size of the P-matrix set is determined by the length of the encoded information bits of the ith sub-block and M, and the size of the b-vector set is determined by M. When the length of the encoded information bits of the ith sub-block is less than M, the size of the P-matrix set is 1, and the size of the b-vector set is determined by the length of the encoded information bits of the ith sub-block. In an example solution, the size of the P-matrix set and the size of the b-vector set may meet the following formula:

When $J \geq M$, $S_{b,i}=2^M$, and $S_{P,i}=2^{J-M}$; or when $J < M$, $S_{b,i}=2^J$, and $S_{P,i}=2^0=1$;

where J is used to indicate the length of the encoded information bits of the ith sub-block, M is used to indicate an order of a binary symmetric matrix of an RM sequence, $S_{b,i}$ is used to indicate the size of the b-vector set, and $S_{P,i}$ is used to indicate the size of the P-matrix set.

In this embodiment, when the length of the encoded information bits of the ith sub-block is equal to M, the size of the P-matrix set and the size of the b-vector set are determined in the following manner: In a possible implementation, the size of the P-matrix set is determined based on the length of the encoded information bits of the ith sub-block and M, and the size of the b-vector set is determined by M. In another implementation, the size of the P-matrix set is 1, and the size of the b-vector set is determined by the length of the encoded information bits of the ith sub-block. That is, when the length of the encoded information bits of the ith sub-block is equal to M, any possible implementation may be selected according to an actual situation to calculate the size of the P-matrix set and the size of the b-vector set.

Determining the size of the P-matrix set and the size of the b-vector set by using the foregoing solution can ensure a relatively low cross-correlation between sequences in an RM sequence codebook that is finally generated by using an RM sequence generation formula.

In another possible implementation, the first communication apparatus selects at least two P-matrix subsets and at least two b-vector subsets based on M, where the at least two P-matrix subsets are used as the P-matrix set, and the at least two b-vector subsets are used as the b-vector set. In this solution, the P-matrix subset and the b-vector subset are predetermined. In an example solution, the P-matrix subset may be obtained from a complete P-matrix set (that is, a specific quantity of P matrices are selected from the complete P-matrix set and classified as a P-matrix subset), and each P-matrix in the P-matrix subset is a binary symmetric matrix with M rows and M columns. Similarly, the b-vector subset is also obtained from the complete b-vector set, and each b vector in the b-vector subset is a binary vector with a length of M. A criterion for selecting the P-matrix subset is that cross-correlation between RM sequences generated based on different b vectors corresponding to P matrices in the P-matrix subset is as low as possible. For selection of the P-matrix set and the b-vector set, the b-vector set may be preferentially fully used, and the quantity of P matrices may be selected as small as possible, to ensure that sequences in the RM sequence codebook that is finally generated by using the RM sequence generation formula have a relatively low cross-correlation.

Optionally, after the size of the P-matrix set and the size of the b-vector set are determined based on the foregoing solution, that the first communication apparatus generates the P-matrix set and the b-vector set based on M, the size of the P-matrix set, the size of the b-vector set, and an information bit set specifically includes the first communication apparatus generates elements of the P-matrix set based on M, the size of the P-matrix set, and the information bit set, and generating elements of the b-vector set based on M, the size of the b-vector set, and the information bit set; and the first communication apparatus generates the P-matrix set according to a preset filling rule and the elements of the P-matrix set, and generates the b-vector set by using a length of the b vector and the elements of the b-vector set. In an example solution, the first communication apparatus may generate a binary vector of the P-matrix set based on M, the size of the P-matrix set, and the information bits of the first sub-block to the (i−1)th sub-block by using a generation formula, and generate a binary vector of the b-vector set based on M, the size of the P-matrix set, and the information bits of the first sub-block to the (i−1)th sub-block by using the generation formula. The generation formula for generating elements of the P-matrix set is as follows:

f(w)=Gw, where f(w) is used to indicate a binary vector of the P-matrix set, and the length of the binary vector meets $$\frac{M(M+1)}{2} * S_{P,i} \text{ or } \frac{M(M-1)}{2} * S_{P,i},$$

where $S_{P,i}$ is used to indicate the size of the P-matrix set, M is used to indicate an order of a binary symmetric matrix of an RM sequence, G is a generator matrix, w is used to indicate an information bit set of the first sub-block to the (i−1)th sub-block, and $$\frac{M(M-1)}{2} * S_{P,i}$$

is used to indicate a length of the binary vector when the P matrix is a matrix whose diagonal elements are all 0s;

The generation formula for generating the elements of the b-vector set is as follows:

f(w)=Gw, where f(w) is used to indicate a binary vector of the b-vector set, and the length of the binary vector meets $M*S_{b,i}$, where $S_{b,i}$ is used to indicate the size of the b-vector set, M is used to indicate an order of a binary symmetric matrix of an RM sequence, G is a generator matrix, and w is used to indicate the information bit set of the first sub-block to the (i−1)th sub-block.

In this embodiment, the preset filling rule includes filling the P matrix in a specified direction such as a row, a column, or a diagonal. A length of the b vector is M.

After generating the P-matrix set and the b-vector set, the first communication apparatus may further establish a mapping relationship between the ith sub-block and the first P matrix and the first b vector. Specific operations are as follows.

The first communication apparatus obtains an index value of each P matrix in the P-matrix set and an index value of each b vector in the b-vector set; the first communication apparatus selects a bit value x and a bit value y based on information bits of the ith sub-block and the information bit length of the ith sub-block, where the bit value x and the bit value y cover the information bits of the ith sub-block; and the first communication apparatus determines the first P matrix based on the bit value x, and determines the first b vector based on the bit value y. In this way, an association relationship is established between the information bits of the ith sub-block and the P matrix and the b vector. Therefore, in a detection process, the information bits of the ith sub-block can be effectively restored based on the P matrix and the b vector.

In this embodiment, the first communication apparatus may obtain an index value of each P matrix in the P-matrix set and an index value of each b vector in the b-vector set in a plurality of manners. For example, the P matrix and the b vector are numbered in a generation order, or an element of the P matrix is directly used as the index value of the P matrix, and an element of the b vector is used as the index value of the b vector. A specific manner is not limited herein.

Optionally, an information bit length of the bit value x is less than or equal to the information bit length of the ith sub-block and is greater than 0, and an index value indicated by the bit value x does not exceed an index value corresponding to the P-matrix set; and an information bit length of the bit value y is less than or equal to the information bit length of the ith sub-block and is greater than 0, and an index value indicated by the bit value y does not exceed an index value corresponding to the b-vector set. In an example solution, the bit value x and the bit value y meet the following conditions: $0<x\leq B_i$ and $2^x\leq S_{P,i}$, and $0<y\leq B_i$ and $2^y\leq S_{b,i}$, where $B_i$ is used to indicate the information bit length of the ith sub-block, $S_{P,i}$ is used to indicate a size of a P-matrix set corresponding to the ith sub-block, and $S_{b,i}$ is used to indicate a size of a b-vector set corresponding to the ith sub-block.

Optionally, that the first communication apparatus determines the first P matrix based on the bit value x includes the first communication apparatus determines the first P matrix from the P-matrix set based on the bit value x and a first index relationship, where the first index relationship is used to indicate a correspondence between an information bit of the ith sub-block and a P matrix in the P-matrix set.

Optionally, that the first communication apparatus determines the first b vector based on the bit value y includes the first communication apparatus determines the first b vector from the b-vector set based on the bit value y and a second index relationship, where the second index relationship is used to indicate a correspondence between an information bit of the ith sub-block and a b vector in the b-vector set.

Optionally, in this embodiment, that the first communication apparatus obtains the matrix order M includes the first communication apparatus receives first configuration information sent by a second communication apparatus, where the first configuration information carries M; or the first communication apparatus receives second configuration information sent by the second communication apparatus, where the second configuration information carries time-frequency resource information of the ith sub-block; and the first communication apparatus determines M based on a quantity of available time-frequency resources indicated by the time-frequency resource information.

Optionally, that the first communication apparatus determines M based on the quantity of available time-frequency resources indicated by the time-frequency resource information includes: the first communication apparatus calculates a difference between 2 to the power of N and the quantity of available time-frequency resources, and uses N that minimizes the difference between the two as M.

According to a second aspect, an embodiment of this application provides a data transmission method. A specific manner of the method includes: a second communication apparatus sends configuration information to a first communication apparatus, where the configuration information is used to indicate a matrix order M, M is a matrix order of an RM sequence corresponding to the first communication apparatus in an ith sub-block, and M and i are positive integers; the second communication apparatus receives the RM sequence that is corresponding to the ith sub-block and that is sent by the first communication apparatus; the second communication apparatus obtains a first P matrix and a first b vector based on the RM sequence; and the second communication apparatus obtains information bits of the ith sub-block based on the first P matrix and the first b vector.

In this embodiment, the second communication apparatus parses out, by using the RM sequence, the information bits sent by the first communication apparatus by using each sub-block, instead of distinguishing each UE only based on only the RM sequence, thereby expanding an application scope of the RM sequence.

Optionally, that the second communication apparatus obtains information bits of the ith sub-block based on the first P matrix and the first b vector includes: the second communication apparatus obtains the bit value x based on the first P matrix, and obtains the bit value y based on the first b vector; and the second communication apparatus obtains information bit information of the ith sub-block based on the bit value x, the bit value y, and a mapping rule. In this embodiment, the bit value x is selected by the first communication apparatus based on information bit information of the ith sub-block, and the bit value x and the bit value y cover the information bits of the ith sub-block.

Optionally, the obtaining the bit value y based on the first b vector includes: the second communication apparatus determines the bit value y based on the first b vector and a second index relationship, where the second index relationship is used to indicate a correspondence between an information bit of the ith sub-block and a b vector in the b-vector set.

Optionally, the second communication apparatus obtains the bit value x based on the first P matrix includes: the second communication apparatus obtains the bit value x based on the first P matrix and a first index relationship, where the first index relationship is used to indicate a correspondence between an information bit of the ith sub-block and a P matrix in the P-matrix set.

Optionally, before the second communication apparatus obtains information bits of the ith sub-block based on the first P matrix and the first b vector, the method further includes: the second communication apparatus parses the RM sequence corresponding to the ith sub-block to obtain the first P matrix and the first b vector.

Optionally, the configuration information carries M; or the configuration information carries time-frequency resource information of the ith sub-block, and the time-frequency resource information is used to indicate a quantity of available time-frequency resources.

According to a third aspect, this application provides a first communication apparatus configured to send data. The apparatus has a function of implementing behavior of the first communication apparatus in the first aspect. The function may be implemented by hardware, or may be implemented by hardware executing corresponding software. The hardware or the software includes one or more modules corresponding to the function.

In a possible implementation, the apparatus includes units or modules configured to perform the steps in the foregoing first aspect. For example, the apparatus includes: an obtaining module, configured to obtain information bit information of an ith sub-block, where i is a positive integer, and the information bit information of the ith sub-block includes information bits of the ith sub-block and an information bit length of the ith sub-block; and obtain a matrix order M, where M is a matrix order of an RM sequence corresponding to the first communication apparatus in the ith sub-block, and M is a positive integer; a processing module, configured to determine a first P matrix and a first b vector based on M and the information bit information of the ith sub-block; and generate, based on the first P matrix and the first b vector, the RM sequence corresponding to the ith sub-block; and a sending module, configured to output the RM sequence corresponding to the ith sub-block.

Optionally, the apparatus further includes a storage module, configured to store program instructions and data that are necessary for the first communication apparatus.

Optionally, the processing module is specifically configured to: obtain a P-matrix set and a b-vector set based on M; and determine the first P matrix from the P-matrix set based on the information bit information of the ith sub-block, and determine the first b vector from the b-vector set.

Optionally, the processing module is specifically configured to: generate a size of the P-matrix set and a size of the b-vector set based on M and the information bit length of the ith sub-block; and generate the P-matrix set and the b-vector set based on M, the size of the P-matrix set, the size of the b-vector set, and an information bit set, where the information bit set includes information bits of at least one of the first sub-block to the ith sub-block.

Optionally, the processing module is specifically configured to: generate a size of the P-matrix set and a size of the b-vector set based on M and a length of encoded information bits of the ith sub-block, where the length of the encoded information bits of the ith sub-block is a sum of a length of check bits after the check bits are added to the ith sub-block and the information bit length of the ith sub-block; and generate the P-matrix set and the b-vector set based on M, the size of the P-matrix set, the size of the b-vector set, and an information bit set.

Optionally, the information bit set includes information bits of at least one of the first sub-block to the ith sub-block; or the information bit set includes at least one of encoded information bits of the first sub-block to encoded information bits of the ith sub-block, and the encoded information bits include check bits and information bits of the sub-block.

Optionally, when the information bit length of the ith sub-block is greater than or equal to M, the size of the P-matrix set is determined by the information bit length of the ith sub-block and M, and the size of the b-vector set is determined by M; or when the information bit length of the ith sub-block is less than M, the size of the P-matrix set is 1, and the size of the b-vector set is determined by the information bit length of the ith sub-block.

Optionally, when the length of the encoded information bits of the ith sub-block is greater than or equal to M, the size of the P-matrix set is determined by the length of the encoded information bits of the ith sub-block and M, and the size of the b-vector set is determined by M; or when the length of the encoded information bits of the ith sub-block is less than M, the size of the P-matrix set is 1, and the size of the b-vector set is determined by the length of the encoded information bits of the ith sub-block.

Optionally, the processing module is specifically configured to: generate elements of all P matrices in the P-matrix set based on M, the size of the P-matrix set, and the information bit set, and generate elements of all b vectors in the b-vector set based on M, the size of the b-vector set, and the information bit set; and generate the P-matrix set according to a preset filling rule and the elements of all P matrices in the P-matrix set, and generate the b-vector set by using a length of the b vector and the elements of all b vectors in the b-vector set.

Optionally, the preset filling rule includes filling the P matrix in a specified direction such as a row, a column, or a diagonal.

Optionally, the processing module is specifically configured to select at least two P-matrix subsets and at least two b-vector subsets based on M, where the at least two P-matrix subsets are used as the P-matrix set, and the at least two b-vector subsets are used as the b-vector set.

Optionally, the processing module is specifically configured to: obtain an index value of each P matrix in the P-matrix set and an index value of each b vector in the b-vector set; select a bit value x and a bit value y based on information bits of the ith sub-block and an information bit length of the ith sub-block, where the bit value x and the bit value y cover the information bits of the ith sub-block; and determine the first P matrix based on the bit value x, and determine the first b vector based on the bit value y.

Optionally, an information bit length of the bit value x is less than or equal to the information bit length of the ith sub-block and is greater than 0, and an index value indicated by the bit value x does not exceed an index value corresponding to the P-matrix set; and an information bit length of the bit value y is less than or equal to the information bit length of the ith sub-block and is greater than 0, and an index value indicated by the bit value y does not exceed an index value corresponding to the b-vector set.

Optionally, the processing module is specifically configured to determine the first P matrix from the P-matrix set based on the bit value x and a first index relationship, where the first index relationship is used to indicate a correspondence between an information bit of the ith sub-block and a P matrix in the P-matrix set.

Optionally, the processing module is specifically configured to determine the first b vector from the b-vector set based on the bit value y and a second index relationship, where the second index relationship is used to indicate a correspondence between an information bit of the ith sub-block and a b vector in the b-vector set.

Optionally, the obtaining module is specifically configured to receive first configuration information sent by the second communication apparatus, where the first configuration information carries M; or the obtaining module is specifically configured to: receive second configuration information sent by the second communication apparatus, where the second configuration information carries time-frequency resource information of the ith sub-block; and determine M based on a quantity of available time-frequency resources indicated by the time-frequency resource information.

Optionally, the obtaining module is specifically configured to: compare 2 to the power of N with the quantity of available time-frequency resources, and use N that minimizes the difference between the two as M.

In a possible implementation, the apparatus includes a processor and a transceiver. The processor is configured to support the first communication apparatus in performing a corresponding function in the method according to the first aspect. The transceiver is configured to: instruct the first communication apparatus to communicate with the second communication apparatus, and send the RM sequence in the foregoing method to the second communication apparatus. Optionally, the apparatus may further include a memory. The memory is configured to be coupled to the processor, and stores program instructions and data that are necessary for the first communication apparatus.

In a possible implementation, when the apparatus is a chip in the first communication apparatus, the chip includes a processing module and a transceiver module. The processing module may be, for example, a processor. The processor is configured to: determine a first P matrix from the P-matrix set based on information bit information of the ith sub-block, and determine a first b vector from the b-vector set; and generate, based on the first P matrix and the first b vector, the RM sequence corresponding to the ith sub-block, where the transceiver module may be, for example, an input/output interface, a pin, or a circuit on the chip, and transmits the RM sequence generated by the processor to another chip or module coupled to the chip. The processing module may execute computer executable instructions stored in a storage unit, to support the first communication apparatus in performing the method according to the first aspect. Optionally, the storage unit may be a storage unit in the chip, for example, a register or a cache. The storage unit may alternatively be a storage unit located outside the chip, for example, a read-only memory (ROM), another type of static storage device that can store static information and instructions, or a random access memory (RAM).

In a possible implementation, the apparatus includes a processor, a baseband circuit, a radio frequency circuit, and an antenna. The processor is configured to control functions of each circuit part. The baseband circuit is configured to generate an RM sequence including signaling information. After the radio frequency circuit performs processing such as analog conversion, filtering, amplification, and up-conversion on the RM sequence, the RM sequence is sent to the second communication apparatus by using the antenna. Optionally, the apparatus further includes a memory, where the memory stores program instructions and data that are necessary for the first communication apparatus.

In a possible implementation, the apparatus includes a communication interface and a logic circuit. The communication interface is configured to: obtain information bit information of an ith sub-block, where i is a positive integer, and the information bit information of the ith sub-block includes information bits of the ith sub-block and an information bit length of the ith sub-block; and obtain a matrix order M, where M is a matrix order of an RM sequence corresponding to the first communication apparatus in the ith sub-block, and M is a positive integer. The logic circuit is configured to: determine a first P matrix and a first b vector based on M and the information bit information of the ith sub-block; and generate, based on the first P matrix and the first b vector, the RM sequence corresponding to the ith sub-block. The communication interface is further configured to output the RM sequence corresponding to the ith sub-block.

The processor mentioned anywhere above may be a general purpose central processing unit (CPU), a microprocessor, an application-specific integrated circuit (ASIC), or one or more integrated circuits configured to control program execution of the data transmission methods in the foregoing aspects.

According to a fourth aspect, an embodiment of this application provides a second communication apparatus applied to data parsing. The apparatus has a function of implementing behavior of the second communication apparatus in the second aspect. The function may be implemented by hardware, or may be implemented by hardware executing corresponding software. The hardware or the software includes one or more modules corresponding to the function.

In a possible implementation, the apparatus includes units or modules configured to perform the steps in the foregoing second aspect. For example, the apparatus includes: a sending module, configured to send configuration information to a first communication apparatus, where the configuration information is used to indicate a matrix order M, M is a matrix order of an RM sequence corresponding to the first communication apparatus in an ith sub-block, and M is a positive integer; a receiving module, configured to receive the RM sequence that is corresponding to the ith sub-block and that is sent by the first communication apparatus; and a processing module, configured to obtain a first P matrix and a first b vector based on the RM sequence, and obtain information bits of the ith sub-block based on the first P matrix and the first b vector.

Optionally, the apparatus further includes a storage module, configured to store program instructions and data that are necessary for the second communication apparatus.

Optionally, the processing module is specifically configured to: obtain a bit value x based on the first P matrix, obtain a bit value y based on the first b vector, and obtain information bit information of the ith sub-block based on the bit value x, the bit value y, and a mapping rule.

Optionally, the processing module is specifically configured to determine the bit value x based on the first P matrix and a first index relationship, where the first index relationship is used to indicate a correspondence between an information bit of the ith sub-block and a P matrix in the P-matrix set.

Optionally, the processing module is specifically configured to determine the bit value y based on the first b vector and a second index relationship, where the second index relationship is used to indicate a correspondence between an information bit of the ith sub-block and a b vector in the b-vector set.

Optionally, the processing module is further configured to parse the RM sequence corresponding to the ith sub-block to obtain the first P matrix and the first b vector.

Optionally, the configuration information carries M; or the configuration information carries time-frequency resource information of the ith sub-block, where the time-frequency resource information is used to indicate a quantity of available time-frequency resources.

In a possible implementation, the apparatus includes a processor and a transceiver. The processor is configured to support the second communication apparatus in performing a corresponding function in the method according to the second aspect. The transceiver is configured to: instruct the second communication apparatus to communicate with the first communication apparatus, and send information or instructions in the foregoing method to the first communication apparatus. Optionally, the apparatus may further include a memory. The memory is configured to be coupled to the processor, and stores program instructions and data that are necessary for the second communication apparatus.

In a possible implementation, when the apparatus is a chip in the second communication apparatus, the chip includes a processing module and a transceiver module. The processing module may be, for example, a processor; and the processor is configured to obtain information bits of the ith sub-block based on the first P matrix and the first b vector. The transceiver module may be, for example, an input/output interface, a pin, or a circuit on the chip, and transmits configuration information to another chip or module coupled to the chip. The processing module may execute computer executable instructions stored in a storage unit, to support the second communication apparatus in performing the method according to the second aspect. Optionally, the storage unit may be a storage unit in the chip, for example, a register or a cache. The storage unit may alternatively be a storage unit located outside the chip, for example, a ROM, another type of static storage device that can store static information and instructions, or a RAM.

In a possible implementation, the apparatus includes a processor, a baseband circuit, a radio frequency circuit, and an antenna. The processor is configured to control functions of each circuit part. The baseband circuit is configured to generate configuration information including signaling information. After the radio frequency circuit performs processing such as analog conversion, filtering, amplification, and up-conversion on the RM sequence, the RM sequence is sent to the first communication apparatus by using the antenna. Optionally, the apparatus further includes a memory, where the memory stores necessary program instructions and data necessary for the second communication apparatus.

In a possible implementation, the apparatus includes a communication interface and a logic circuit. The communication interface is configured to send configuration information to the first communication apparatus, where the configuration information is used to indicate a matrix order M, M is a matrix order of an RM sequence corresponding to the first communication apparatus in an ith sub-block, and M is a positive integer. The communication interface is configured to receive the RM sequence that is corresponding to the ith sub-block and that is sent by the first communication apparatus. The logic circuit is configured to: obtain a first P matrix and a first b vector based on the RM sequence; and obtain information bits of the ith sub-block based on the first P matrix and the first b vector.

The processor mentioned anywhere above may be a CPU, a microprocessor, an ASIC, or one or more integrated circuits configured to control program execution of the data transmission methods according to the foregoing aspects.

According to a fifth aspect, an embodiment of this application provides a computer-readable storage medium. The computer storage medium stores computer instructions, and the computer instructions are used to perform the method according to any possible implementation of any one of the foregoing aspects.

According to a sixth aspect, an embodiment of this application provides a computer program product including instructions. When the computer program product runs on a computer, the computer is enabled to perform the method according to any one of the foregoing aspects.

According to a seventh aspect, this application provides a chip system. The chip system includes a processor, configured to support a communication apparatus in implementing functions in the foregoing aspects, for example, generating or processing data and/or information in the foregoing methods. In a possible design, the chip system further includes a memory. The memory is configured to store program instructions and data that are necessary for the communication apparatus, to implement the function in any one of the foregoing aspects. The chip system may be formed by chips, or may include chips and other discrete components.

In a possible implementation, when running on the first communication apparatus side, the chip system may support the first communication apparatus in performing the method according to the first aspect.

In still another possible implementation, when running on the second communication apparatus side, the chip system may support the second communication apparatus in performing the method according to the second aspect.

According to an eighth aspect, an embodiment of this application provides a communication system. The system includes the first communication apparatus and the second communication apparatus in the foregoing aspects.

DETAILED DESCRIPTION OF ILLUSTRATIVE EMBODIMENTS

Figure 1:
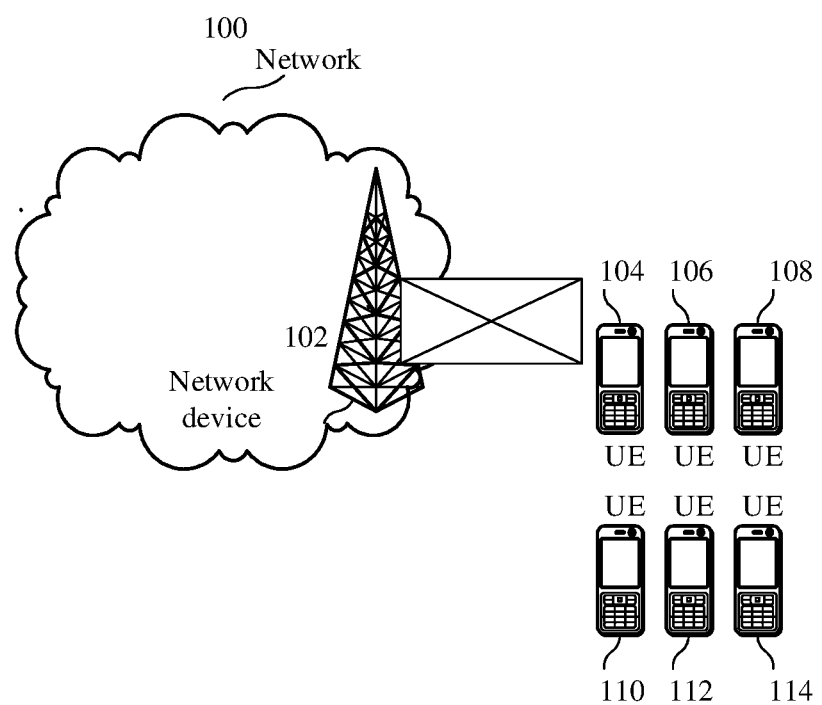
FIG. 1 is a schematic diagram of an embodiment of a system architecture according to this application.

To make objectives, technical solutions, and advantages of this application clearer, the following describes embodiments of this application with reference to accompanying drawings. It is clear that the described embodiments are merely some but not all of embodiments of this application. A person of ordinary skill in the art may learn that, as a new application scenario emerges, the technical solutions provided in embodiments of this application are also applicable to a similar technical problem.

In the specification, claims, and accompanying drawings of this application, the terms "first", "second", and the like are intended to distinguish between similar objects but do not necessarily indicate a specific order or sequence. It should be understood that the data used in such a way are interchangeable in appropriate circumstances, so that embodiments described herein can be implemented in an order other than the content illustrated or described herein. In addition, terms "include", "comprise", and any other variant thereof are intended to cover non-exclusive inclusion. For example, a process, a method, a system, a product, or a device that includes a series of steps or modules is not necessarily limited to those expressly listed steps or modules, but may include other steps or modules not expressly listed or inherent to the process, the method, the product, or the device. Names or numbers of steps in this application do not mean that the steps in the method procedure need to be performed in a time/logical sequence indicated by the names or numbers. An execution sequence of the steps in the procedure that have been named or numbered can be changed based on a technical objective to be achieved, provided that same or similar technical effects can be achieved. Unit division in this application is logical division and may be other division during actual implementation. For example, a plurality of units may be combined or integrated into another system, or some features may be ignored or not performed. In addition, the displayed or discussed mutual couplings or direct couplings or communication connections may be implemented by using some interfaces. The indirect couplings or communication connections between the units may be implemented in electronic or other similar forms. This is not limited in this application. In addition, units or subunits described as separate components may or may not be physically separate, may or may not be physical units, or may be distributed into a plurality of circuit units. Some or all of the units may be selected according to actual requirements to achieve the objectives of the solutions of this application.

It should be understood that the technical solutions in embodiments of this application may be applied to various communication systems, such as a Global System for Mobile Communication (GSM) system, a Code Division Multiple Access (CDMA) system, a Wideband Code Division Multiple Access (WCDMA) system, a Long Term Evolution (LTE) system, an LTE Frequency Division Duplex (FDD) system, an LTE Time Division Duplex (TDD) system, a Universal Mobile Telecommunication System (UMTS), a 5G communication system, and a future wireless communication system.

In this application, the first communication apparatus may be a user equipment. This application describes the embodiments with reference to the user equipment. The user equipment (UE) may also be referred to a terminal device, an access terminal, a subscriber unit, a subscriber station, a mobile station, a remote station, a remote terminal, a mobile device, a user terminal, a terminal, a wireless communication device, a user agent, or a user apparatus. The access terminal may be a cellular phone, a cordless phone, a Session Initiation Protocol (SIP) phone, a Wireless Local Loop (WLL) station, a personal digital assistant (PDA), a handheld device having a wireless communication function, a computing device or another processing device connected to a wireless modem, a vehicle-mounted device, a wearable device, a terminal device in a future 5G network, or a terminal device in a future evolved PLMN network.

In this application, the second communication apparatus may be a network device. This application describes the embodiments with reference to the network device. The network device may be a device configured to communicate with a user equipment. For example, the network device may be a base transceiver station (BTS) in a GSM system or a CDMA system, may be a NodeB (NB) in a WCDMA system, or may be an evolved NodeB (eNB or eNodeB) in an LTE system. Alternatively, the network device may be a relay station, an access point, a vehicle-mounted device, a wearable device, a network-side device in a 5G network, or a network device in a future evolved public land mobile network (PLMN).

FIG. 1 is a schematic diagram of an architecture of a communication system to which an embodiment of this application is applied. As shown in FIG. 1, the communication system 100 may include a network device 102 and user equipments 104 to 114 (referred to as UE in the figure) that are connected in a wireless, wired, or another manner. A network in embodiments of this application may be a PLMN network, a device-to-device (D2D) network, a machine to machine (M2M) network, or another network. FIG. 1 is merely a simplified schematic diagram used as an example. The network may further include another network device, which is not shown in FIG. 1.

To better understand embodiments of this application, concepts that may be used in the following embodiments are first explained herein.

RM (Reed Muller) code: The RM code is a very important linear block code, and has advantages such as simple construction, rich structure features, and a reachable erasure channel capacity.

Figure 2:
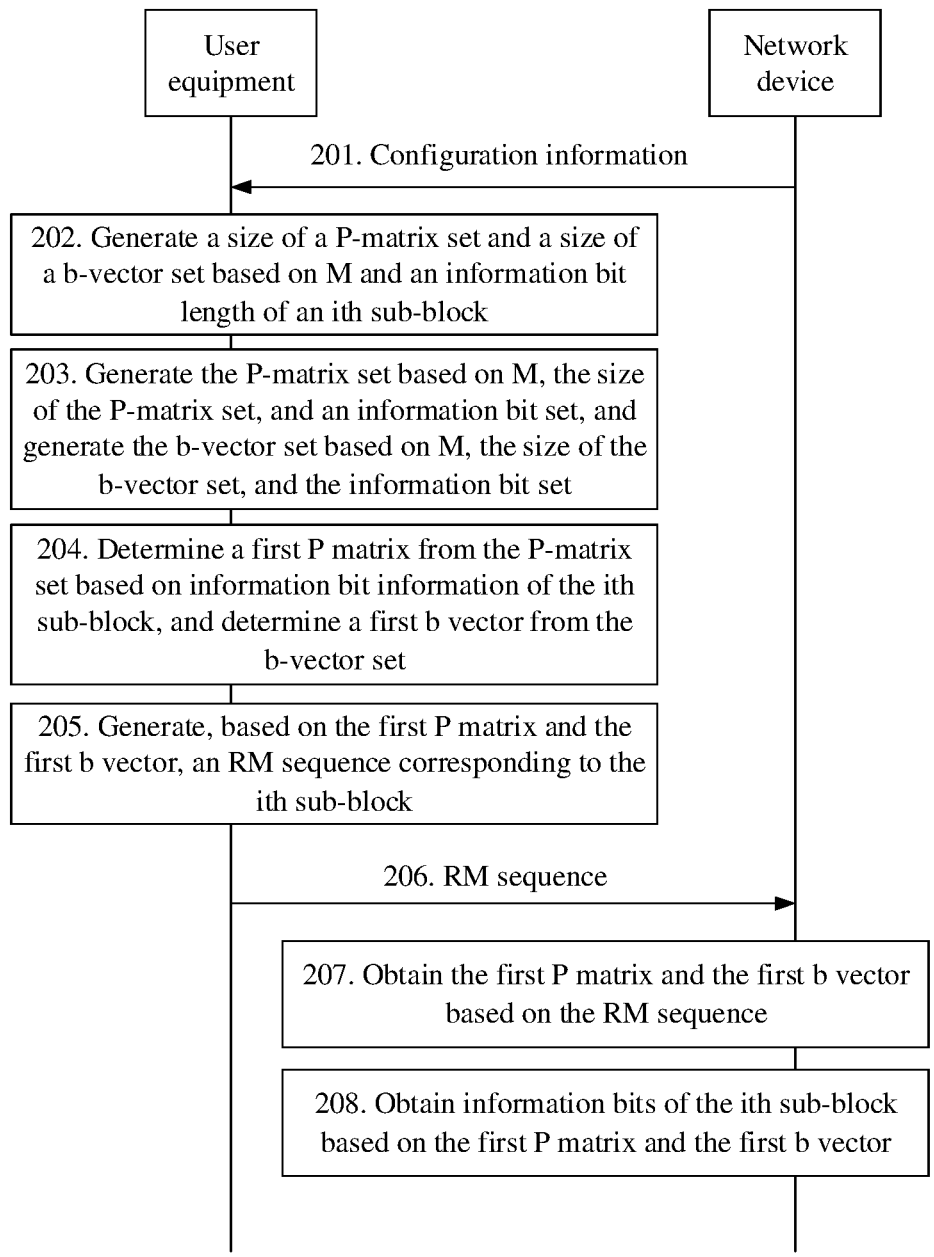
FIG. 2 is a schematic diagram of an embodiment of a data transmission method according to an embodiment of this application.

Specifically, referring to FIG. 2, an embodiment of a data transmission method in embodiments of this application includes the following steps.

201. A user equipment receives configuration information sent by a network device, where the configuration information is used to indicate a matrix order M, M is a matrix order of an RM sequence corresponding to the user equipment in an ith sub-block, and M and i are positive integers.

The user equipment receives the configuration information sent by the network device, where the configuration information is used to indicate the matrix order M, and the order M is a matrix order of the RM sequence corresponding to the user equipment in the ith sub-block.

In this embodiment, the RM sequence is generated by using the P matrix and the b vector based on a generation formula, where the generation formula may be:

$$\phi_{P,b}(j) = A * i^{(2b+Pa_{j-1})^T a_{j-1}};$$

where $\phi_{P,b}(j)$ is a value of a jth element in the second-order RM sequence, A is an amplitude normalization factor, $i^2 = -1$, P is a binary symmetric matrix with M rows and M columns, b is a binary vector with a length of M, and $a_{j-1}$ is a binary vector with a length of M, which is converted from an integer value j−1. It can be seen from the generation formula of the RM sequence that, for each fixed P matrix (which may be compared to a root of a ZC sequence), changing a value of the b vector may generate space of 2 to the power of M orthogonal RM sequences. RM sequences constructed using different P matrices are non-orthogonal. It may be understood that the binary symmetric matrix in this embodiment is a symmetric matrix formed by only two types of elements: 0 and 1, and the binary vector is a vector value formed by only two types of elements: 0 and 1. In this embodiment, although the P matrix and the b vector are used in the RM sequence generation formula to name the matrix and the vector that are used to generate the RM sequence, the P matrix and the b vector are merely example descriptions. Actually, the matrix and the vector that are used to generate the RM sequence may be named in another manner. Therefore, the P-matrix set and the b-vector set in this embodiment are merely example descriptions, and another naming manner may also be used. This is not limited herein.

It may be understood that, in this embodiment of this application, the network device may directly add M to the configuration information, that is, the network device directly specifies the order M; or the network device adds the time-frequency resource indication information to the configuration information, and then the user equipment determines M based on the quantity of available time-frequency resources indicated by the time-frequency resource indication information. The time-frequency resource indication information may be used to indicate a quantity of resource elements for sending the reference signal sequence, or used to indicate a resource pattern for sending the reference signal sequence, or used to indicate a time-frequency resource for sending the parameter signal sequence, provided that the time-frequency resource indication information can be used to indicate the quantity of available time-frequency resources for sending the RM sequence. Specific indication information is not limited herein. In an example solution, when determining M based on the quantity of available time-frequency resources, the user equipment may obtain a difference between 2 to the power of N and the quantity of available time-frequency resources, and use N that minimizes the difference between the two as M. For example, if the quantity of available time-frequency resources is 72, 2 to the power of 6 is 64, and 2 to the power of 7 is 128. A difference between 64 and 72 is 8, and a difference between 128 and 72 is 72. Therefore, M is 6. It may be understood that the length of the RM sequence is equal to 2 to the power of M. Therefore, after M is determined by using the foregoing solution, the length of the RM sequence is also determined. In a transmission process, when the length of the RM sequence is less than the quantity of available time-frequency resources, some bits in the RM sequence may be repeatedly carried on a redundant time-frequency resource, so that the length of the RM sequence is supplemented to the quantity of available time-frequency resources; or when the length of the RM sequence is greater than the quantity of available time-frequency resources, some bits in the RM sequence may be truncated, so that the length of the RM sequence is equal to the quantity of available time-frequency resources. In this embodiment, a plurality of manners may be used to select some bits in the RM sequence to be repeatedly carried on the time-frequency resource or truncated. For example, a location for supplementing or truncation may be randomly selected or selected based on a given rule. This is not specifically limited herein.

202. The user equipment generates a size of the P-matrix set and a size of the b-vector set based on M and the information bit length of the ith sub-block.

In this embodiment, the information bit length of the ith sub-block is recorded as $B_i$, i=1, 2, ..., n (it may be understood that the information bit length of the ith sub-block herein is a length of all information bits of the ith sub-block), the information bits of the ith sub-block are $w_i$ (it may be understood that the information bits of the ith sub-block herein are used to indicate the information bits occupied by the current user equipment on the ith sub-block in this embodiment, and in actual application, one sub-block may carry information bits of a plurality of active user equipments), the size of the P-matrix set corresponding to the ith sub-block is $S_{P,i}$, and the size of the b-vector set corresponding to the ith sub-block is $S_{b,i}$. In an example solution, if the information bits of the first user equipment in the ith sub-block are 011011, the information bit length of the ith sub-block is 6. The size of the P-matrix set corresponding to the ith sub-block and the size of the b-vector set corresponding to the ith sub-block are determined by the information bit length of the ith sub-block. The size of the P-matrix set meets the following condition:

$$1 \leq S_{P,i} \leq 2^{\frac{M(M+1)}{2}};$$

and the size of the b-vector set meets the following condition: $1 \leq S_{b,i} \leq 2^M$. To ensure a relatively low cross-correlation between RM sequences in the RM sequence codebook set that is finally generated by using the RM sequence generation formula, the b-vector complete set $S_{b,i}=2^M$ may be preferably selected, and the quantity of P matrices may be selected as small as possible (that is, a relatively small value may be selected for the size of the P-matrix set). When the information bit length of the ith sub-block is greater than or equal to M, the size of the P-matrix set is determined by a difference between the information bit length of the ith sub-block and M, and the size of the b-vector set is determined by M; or when the information bit length of the ith sub-block is less than M, the size of the P-matrix set is 1, and the size of the b-vector set is determined by the information bit length of the ith sub-block. In an example solution, the size of the P-matrix set and the size of the b-vector set may be determined based on the following solution:

When $B_i \geq M$, $S_{b,i}=2^M$, and $S_{P,i}=2^{B_i-M}$; or when $B_i < M$, $S_{b,i}=2^{B_i}$, and $S_{P,i}=2^0=1$;

where $B_i$ is used to indicate the information bit length of the ith sub-block, M is used to indicate an order of a binary symmetric matrix of an RM sequence, $S_{b,i}$ is used to indicate the size of the b-vector set, and $S_{P,i}$ is used to indicate the size of the P-matrix set. In this embodiment, when the information bit length of the ith sub-block is equal to M, a manner of determining the size of the P-matrix set and the size of the b-vector set is as follows: In a possible implementation, the size of the P-matrix set may be determined based on a difference between the information bit length of the ith sub-block and M, and the size of the b-vector set is determined by M. In another implementation, the size of the P-matrix set is 1, and the size of the b-vector set is determined by the information bit length of the ith sub-block. That is, when the information bit length of the ith sub-block is equal to M, any possible implementation may be selected according to an actual situation to calculate the size of the P-matrix set and the size of the b-vector set. In an example solution, assuming that M=6 and $B_i=10$, the size of the b-vector set is $S_{b,i}=2^M=2^6=64$, and the size of the P-matrix set is $S_{P,i}=2^{B_i-M}=2^4=16$. If M=6 and $B_i=5$, the size of the b-vector set is $S_{b,i}=2^{B_i}=2^5=32$, the user equipment specifies one P matrix, and the size of the P-matrix set is 1. If M=6 and $B_i=6$, the size of the b-vector set is $S_{b,i}=2^{B_i}=2^6=64$, the user equipment specifies one P matrix, and the size of the P-matrix set is 1. In addition, the size of the b-vector set may also be $S_{b,i}=2^M=2^6=64$, and the size of the P-matrix set is $S_{P,i}=2^{B_i-M}=2^0=1$.

In this embodiment, to reduce a detection difficulty of the network device, when the sub-blocks are obtained through division, it may be designed that information bit lengths of the sub-blocks decrease sequentially, that is, $B_1 > B_2 > \ldots > B_n$ is met. That is, the size of the P-matrix set of a next sub-block decreases, and the size of the b-vector set also decreases.

203. The user equipment generates a P-matrix set based on M, the size of the P-matrix set, and an information bit set, and generates a b-vector set based on M, the size of the b-vector set, and the information bit set.

To establish a cascading relationship between the sub-blocks, the information bit set includes information bits of at least one of the first sub-block to the ith sub-block. The user equipment generates elements of the P-matrix set based on M, the size of the P-matrix set, and the information bit set, and generate elements of the b-vector set based on M, the size of the b-vector set, and the information bit set; and finally, the user equipment generates the P-matrix set and the b-vector set based on preset filling.

In an example solution, the user equipment may generate a binary vector of the P-matrix set based on M, the size of the P-matrix set, and the information bits of the first sub-block to the (i−1)th sub-block by using a generation formula, and generate a binary vector of the b-vector set based on M, the size of the P-matrix set, and the information bits of the first sub-block to the (i−1)th sub-block by using the generation formula. The generation formula for generating elements of the P-matrix set is as follows:

f(w)=Gw, where f(w) is used to indicate a binary vector of the P-matrix set, and the length of the binary vector meets $$\frac{M(M+1)}{2} * S_{P,i} \text{ or } \frac{M(M-1)}{2} * S_{P,i},$$

where $S_{P,i}$ is used to indicate the size of the P-matrix set, M is used to indicate an order of a binary symmetric matrix of an RM sequence, G is a generator matrix, w is used to indicate an information bit set of the first sub-block to the (i−1)th sub-block, and $$\frac{M(M-1)}{2} * S_{P,i}$$

is used to indicate a length of the binary vector when the P matrix is a matrix whose diagonal elements are all 0s;

The generation formula for generating the elements of the b-vector set is as follows:

f(w)=Gw, where f(w) is used to indicate a binary vector of the b-vector set, and the length of the binary vector meets $M*S_{b,i}$, where $S_{b,i}$ is used to indicate the size of the b-vector set, M is used to indicate an order of a binary symmetric matrix of an RM sequence, G is a generator matrix, and w is used to indicate the information bit set of the first sub-block to the (i−1)th sub-block.

In an example solution, it is assumed that the ith sub-block is a fourth sub-block, information bits of the first sub-block are 011010, and an information bit length of the first sub-block is 6; information bits of the second sub-block are 010100, and an information bit length of the second sub-block is 6; information bits of the third sub-block are 100101, and an information bit length of the third sub-block is 6; and information bits of the fourth sub-block are 1010010010, and the information bit length of the fourth sub-block is 10. Because M is 6, a size of the P-matrix set corresponding to the fourth sub-block is $S_{P,i}=2^{B_i-M}=2^4=16$, and a size of the b-vector set is $S_{b,i}=2^M=2^6=64$. Because the size of the b-vector set is a maximum value, the b-vector set may be obtained by traversing a 6-order vector formed by 0 and 1, that is, the b vector includes (000000, 000001, 000010, . . . , 111111). A size of the P-matrix set is 16. Because the P-matrix is a binary symmetric matrix, each P-matrix needs a maximum of $$\frac{M(M+1)}{2} = \frac{6(6+1)}{2} = 21$$

elements (each element is 0 or 1). In this case, a total of 336 bits are used to generate the elements of the P-matrix set. Information bits of the first sub-block to the third sub-block, that is, a total of 18 bits (that is, 011010010100100101) are encoded (that is, by using a generation formula) to generate 336 bits, so as to obtain corresponding elements of the P-matrix set. Then, the user equipment generates the P-matrix set from the 336 bits according to a preset filling rule, with every 21 elements forming a group. It may be understood that if the P matrix is a binary symmetric matrix whose diagonal is zero, each P matrix needs only $$\frac{M(M-1)}{2} = \frac{6(6-1)}{2} = 15$$

elements.

In this embodiment, the preset filling rule may be filling by row, by column, or by diagonal. In an example solution, the user equipment fills the P matrix by row. In this case, a filling order of the P matrix may be shown in FIG. 2a. In a solid box, filling is performed based on 21 elements; and in a dashed box, filling is performed based on a binary symmetry rule.

It may be understood that, in the foregoing solution, specific implementations of generating the elements of the P-matrix set or the elements of the b-vector set by using the generator matrix include the following several possible implementations.

In a possible implementation, the user equipment constructs a low-density parity-check (LDPC) code of a corresponding bit rate, and performs encoding to obtain the elements of the P-matrix set and the elements of the b-vector set.

In another possible implementation, the user equipment uses LDPC code of any code rate to obtain the elements of the P-matrix set and the elements of the b-vector set through puncturing or repetition.

It may be understood that the foregoing solution is merely an example solution, and the user equipment may alternatively perform encoding by using repetition code, polar code, or BCH code.

204. The user equipment determines a first P matrix from the P-matrix set based on the information bit information of the ith sub-block, and determines a first b vector from the b-vector set, where the information bit information of the ith sub-block includes the information bits of the ith sub-block and the information bit length of the ith sub-block.

After obtaining the P-matrix set and the b-vector set, the user equipment obtains an index value of the P matrix in the P-matrix set, and obtains an index value of the b vector in the b-vector set; and then determines the first P matrix and the first b vector based on the information bit length and the information bits of the ith sub-block, the index value of the P matrix in the P-matrix set, and the index value of the b vector in the b-vector set.

Optionally, the user equipment may obtain the index value of the P matrix in the P-matrix set in the following several possible implementations.

In a possible implementation, the P matrix is numbered as a decimal number in a generation order of the P matrix. For example, an index value of a first generated P matrix is 0, an index value of a second generated P matrix is 1, . . . , and an index value of an $S_{b,i}$th generated P matrix is $S_{P,i}-1$.

In another possible implementation, the elements of the P matrix are converted into decimal numbers, and the decimal numbers are sorted in descending or ascending order, and then are numbered sequentially. In an example solution, if the P-matrix set includes six P matrices, and elements of the P matrices are respectively (25, 30, 45, 58, 97, 12) after being converted into decimal data, corresponding index values are obtained after sorting in descending order.

In another possible implementation, an element in the P matrix is directly used as the index value of the P matrix.

Similarly, the user equipment may also generate the index value of each b vector in the b-vector set by using the foregoing solution. Details are not described herein again.

After generating the index value of the P matrix and the index value of the b vector, the user equipment establishes a mapping relationship between the ith sub-block and the first P matrix and the ith sub-block and the first b vector based on information bit information of the ith sub-block (that is, information bits of the ith sub-block and an information bit length of the ith sub-block).

In an example solution, the user equipment selects the bit value x and the bit value y based on the information bit information of the ith sub-block, where the bit value x and the bit value y cover the information bits of the ith sub-block; and the user equipment determines the first P matrix based on the bit value x, and determines the first b vector based on the bit value y. In this embodiment, that the bit value x and the bit value y cover the information bits of the ith sub-block is used to indicate that the bit value x and the bit value y include all the information bits of the ith sub-block. In an example solution, if the information bits of the ith sub-block are 101100, the bit value x may be 1011, and the bit value y may be 1100. Similarly, the bit value x may also be 10110, and the bit value y may be 1100.

In the foregoing solution, an information bit length of the bit value x is less than or equal to the information bit length of the ith sub-block and is greater than 0, and an index value indicated by the bit value x does not exceed an index value corresponding to the P-matrix set; and an information bit length of the bit value y is less than or equal to the information bit length of the ith sub-block and is greater than 0, and an index value indicated by the bit value y does not exceed an index value corresponding to the b-vector set. In an example solution, the bit value x and the bit value y meet the following conditions: $0<x\leq B_i$ and $2^x \leq S_{P,i}$, and $0<y\leq B_i$ and $2^y \leq S_{b,i}$, where $B_i$ is used to indicate the information bit length of the ith sub-block, $S_{P,i}$ is used to indicate a size of a P-matrix set corresponding to the ith sub-block, and $S_{b,i}$ is used to indicate a size of a b-vector set corresponding to the ith sub-block.

Based on the foregoing solution, a specific operation of determining, by the user equipment, the first P matrix based on the bit value x, and determining the first b vector based on the bit value y may be as follows.

In a possible implementation, the user equipment determines the first P matrix from the P-matrix set based on the bit value x and a first index relationship, where the first index relationship is used to indicate a correspondence between an information bit of the ith sub-block and a P matrix in the P-matrix set; the user equipment determines the first b vector from the b-vector set based on the bit value y and a second index relationship, where the second index relationship is used to indicate a correspondence between an information bit of the ith sub-block and a b vector in the b-vector set.

In this embodiment, the first index relationship may be a preset mapping relationship or a mapping relationship obtained through calculation based on the bit value x, and the second index relationship may be a preset mapping relationship or a mapping relationship obtained through calculation based on the bit value y.

In an example solution, the user equipment sets a mapping relationship, and determines that the bit value x corresponds to the first P matrix and that the bit value y corresponds to the first b vector.

In another example solution, the user equipment converts the bit value x into a value that has a same counting manner as the index value of the P matrix, and then determines the first P matrix based on a preset rule and the value corresponding to the bit value x. In addition, the user equipment converts the bit value y into a value that has a same counting manner as the index value of the b vector, and then determines the first b vector based on the preset rule and the value corresponding to the bit value y. It may be understood that the preset rule is that a P matrix corresponding to an index value that is the same as the value corresponding to the bit value x is selected as the first P matrix, and a b vector corresponding to the index value that is the same as the value corresponding to the bit value y is selected as the first b vector; or the preset rule is that a P matrix corresponding to an index value that differs from the value corresponding to the bit value x by a fixed preset value is selected as the first P matrix, and a b vector corresponding to an index value that differs from the value corresponding to the bit value y by a fixed preset value is selected as the first b vector. Diversified rules may be preset, and the preset rule is not specifically limited herein, provided that the first index relationship and the second index relationship are established. For example, the index value of the P matrix in the P-matrix set is a decimal value and is numbered from 0, and the index value of the b vector in the b-vector set is a decimal value and is encoded from 0. A decimal value converted from the bit value x is 6, and a decimal value converted from the bit value y is 8. In this case, the first P matrix is a P matrix whose index value is 6, and the first b vector is a b vector whose index value is 8.

In this embodiment, the first P matrix that corresponds to the first sub-block and the first b vector are used as a preset fixed matrix and a preset fixed vector, respectively.

205. The user equipment generates, based on the first P matrix and the first b vector, the RM sequence corresponding to the ith sub-block.

After obtaining the first P matrix and the first b vector, the user equipment generates the RM sequence based on the RM sequence generation formula $$\phi_{P,b}(j) = A * i^{(2b+Paj-1)^{T}aj-1}.$$

206. The user equipment outputs the RM sequence corresponding to the ith sub-block to the network device.

Figures 2A, 2B:
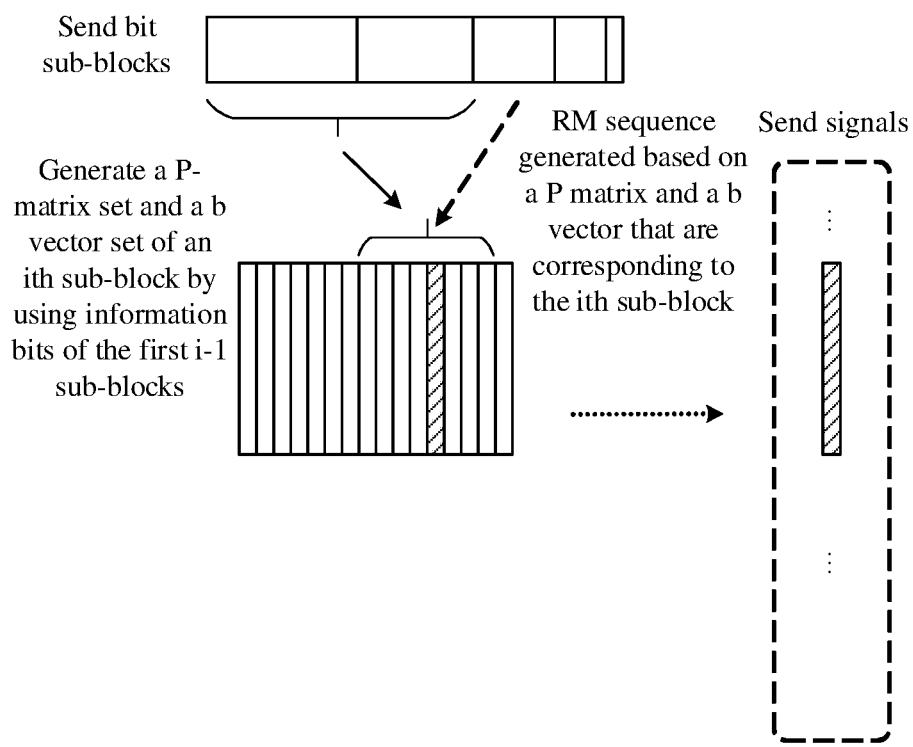
FIG. 2*a* is a schematic diagram of filling of a P matrix according to an embodiment of this application.
FIG. 2*b* is a schematic diagram of outputting an RM sequence according to an embodiment of this application.

In an example solution, that the user equipment outputs the RM sequence to the network device may be shown in FIG. 2b. An RM sequence set of the ith sub-block is generated based on information bits of the first (i−1) sub-blocks; and then a corresponding RM sequence is selected from the RM sequence set, and is output to the network device.

207. The network device obtains the first P matrix and the first b vector based on the RM sequence.

After receiving the RM sequence, the network device obtains, based on an RM sequence detection algorithm, the first P matrix and the first b vector that are used to generate the RM sequence.

In this embodiment, the RM sequence detection algorithm may be a detection algorithm of a fast user detection framework based on successive signal cancellation. A specific implementation process is not described herein again.

208. The network device obtains the information bits of the ith sub-block based on the first P matrix and the first b vector.

The network device obtains the bit value x corresponding to the first P matrix and the bit value y corresponding to the first b vector through calculation based on the first P matrix, the first b vector, the first index relationship determined through negotiation, and the second index relationship; and finally restores the information bits of the ith sub-block based on the bit value x and the bit value y, and a rule selected for generating the bit value x and the bit value y.

This embodiment provides only a process of sending an RM sequence by one active user equipment on one sub-block, but an active user equipment on another sub-block and a plurality of active user equipments on one sub-block all send the RM sequence in the foregoing manner. Details are not described herein again.

In this embodiment, a P-matrix set and a b-vector set are dynamically generated for each sub-block, thereby reducing storage overheads of the user equipment. In addition, the P-matrix set of each sub-block is generated based on the information bits of the sub-block preceding the current sub-block, thereby improving the cascading relationship between the sub-blocks and improving detection correctness.

Figure 3:
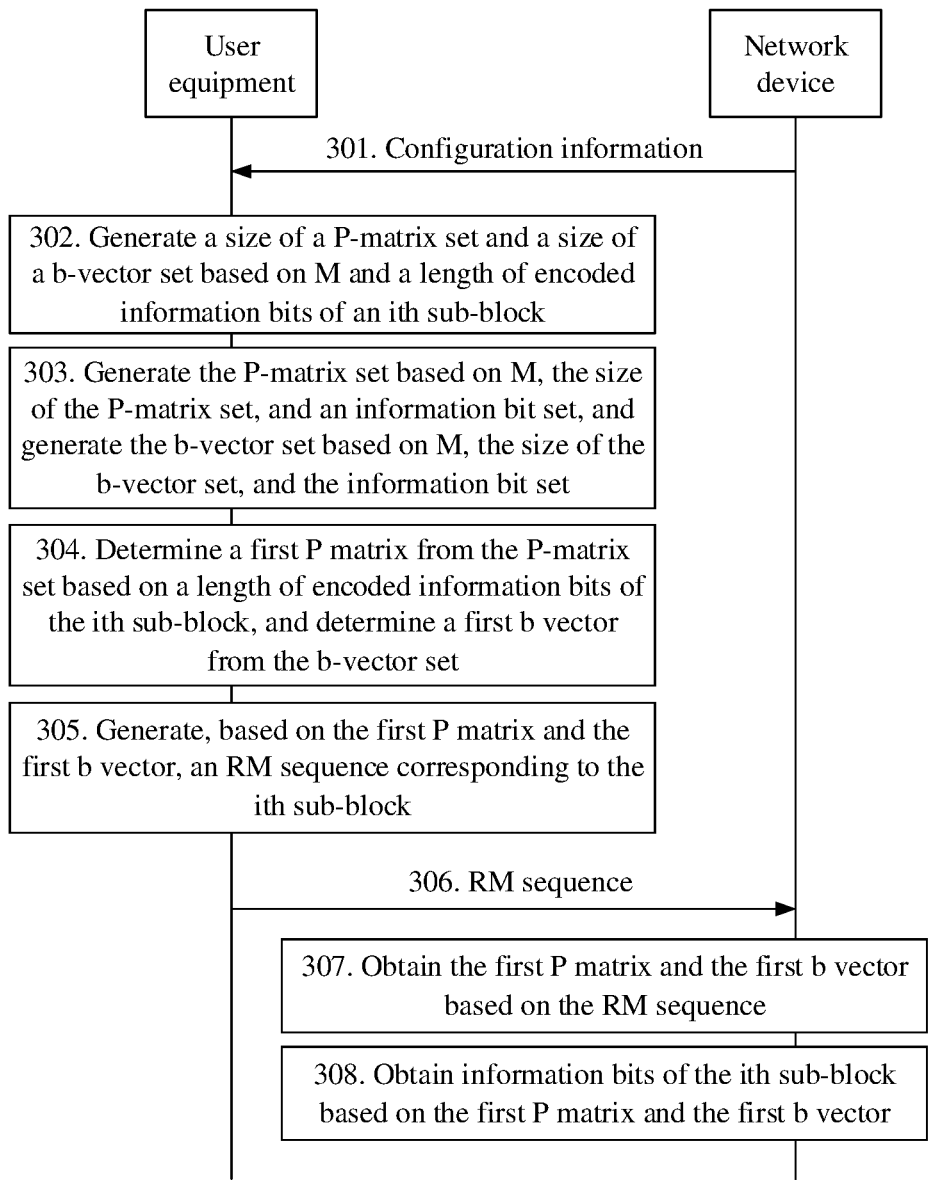
FIG. 3 is a schematic diagram of another embodiment of a data transmission method according to an embodiment of this application.

Specifically, referring to FIG. 3, an embodiment of a data transmission method in embodiments of this application includes the following steps.

301. A user equipment receives configuration information sent by a network device, where the configuration information is used to indicate a matrix order M, M is a matrix order of an RM sequence corresponding to the user equipment in an ith sub-block, and M and i are positive integers.

The user equipment receives the configuration information sent by the network device, where the configuration information is used to indicate the matrix order M, and the order M is a matrix order of the RM sequence corresponding to the user equipment in the ith sub-block.

In this embodiment, the RM sequence is generated by using the P matrix and the b vector based on a generation formula, where the generation formula may be:

$$\phi_{P,b}(j)=A*i^{(2b+Pa_{j-1})^T a_{j-1}};$$

where $\phi_{P,b}(j)$ is a value of a j jth element in the second-order RM sequence, A is an amplitude normalization factor, $i^2=-1$, P is a binary symmetric matrix with M rows and M columns, b is a binary vector with a length of M, and $a_{j-1}$ is a binary vector with a length of M, which is converted from an integer value j−1. It can be seen from the generation formula of the RM sequence that, for each fixed P matrix (which may be compared to a root of a ZC sequence), changing a value of the b vector may generate space of 2 to the power of M orthogonal RM sequences. RM sequences constructed using different P matrices are non-orthogonal. It may be understood that the binary symmetric matrix in this embodiment is a symmetric matrix formed by only two types of elements: 0 and 1, and the binary vector is a vector value formed by only two types of elements: 0 and 1. In this embodiment, although the P matrix and the b vector are used in the RM sequence generation formula to name the matrix and the vector that are used to generate the RM sequence, the P matrix and the b vector are merely example descriptions. Actually, the matrix and the vector that are used to generate the RM sequence may be named in another manner. Therefore, the P-matrix set and the b-vector set in this embodiment are merely example descriptions, and another naming manner may also be used. This is not limited herein.

It may be understood that, in this embodiment of this application, the network device may directly add M to the configuration information, that is, the network device directly specifies the order M; or the network device adds the time-frequency resource indication information to the configuration information, and then the user equipment determines M based on the quantity of available time-frequency resources indicated by the time-frequency resource indication information. The time-frequency resource indication information may be used to indicate a quantity of resource elements for sending the reference signal sequence, or used to indicate a resource pattern for sending the reference signal sequence, or used to indicate a time-frequency resource for sending the parameter signal sequence, provided that the time-frequency resource indication information can be used to indicate the quantity of available time-frequency resources for sending the RM sequence. Specific indication information is not limited herein. In an example solution, when determining M based on the quantity of available time-frequency resources, the user equipment may obtain a difference between 2 to the power of N and the quantity of available time-frequency resources, and use N that minimizes the difference between the two as M. For example, if the quantity of available time-frequency resources is 72, 2 to the power of 6 is 64, and 2 to the power of 7 is 128. A difference between 64 and 72 is 8, and a difference between 128 and 72 is 72. Therefore, M is 6. It may be understood that the length of the RM sequence is equal to 2 to the power of M. Therefore, after M is determined by using the foregoing solution, the length of the RM sequence is also determined. In a transmission process, when the length of the RM sequence is less than the quantity of available time-frequency resources, some bits in the RM sequence may be repeatedly carried on a redundant time-frequency resource, so that the length of the RM sequence is supplemented to the quantity of available time-frequency resources; or when the length of the RM sequence is greater than the quantity of available time-frequency resources, some bits in the RM sequence may be truncated, so that the length of the RM sequence is equal to the quantity of available time-frequency resources. In this embodiment, a plurality of manners may be used to select some bits in the RM sequence to be repeatedly carried on the time-frequency resource or truncated, for example, some unimportant bits may be randomly selected or selected. This is not specifically limited herein.

302. The user equipment generates the size of the P-matrix set and the size of the b-vector set based on M and the length of the encoded information bits of the ith sub-block.

In this embodiment, given a code rate and a quantity of sub-blocks, a length of encoded information bits (in this case, the length of the encoded information bits is a total information bit length) is equal to an information bit length (which is an original information bit length) divided by the code rate (B/R). Therefore, an information bit length of each encoded sub-block meets J=B/R/n, that is, lengths of the encoded information bits of all sub-blocks are the same. In an example solution, assuming that the code rate is 0.5, the original information bit length is 50, and the quantity of sub-blocks is 5, the information bit length of each encoded sub-block is 20. In this embodiment, encoding sub-blocks is equivalent to adding check bits to each sub-block. The information bit length of each sub-block is denoted as $B_i$, i=1, 2, . . . , n, and the length of check bits is denoted as $P_i$, i=1, 2, . . . , n. Therefore, $J=B_i+P_i$, the check bits of the ith sub-block are generated by using the information bits of the first sub-block to the (i−1)th sub-block (or the first sub-block to the i sub-block) based on a rule such as convolutional code or Hamming code.

After the check bits are added, the user equipment may determine the size of the P-matrix set and the size of the b-vector set in the following several possible implementations.

In a possible implementation, the user equipment determines the size of the P-matrix set and the size of the b-vector set by using the length of the encoded information bits of the ith sub-block. In an example solution, the length of the encoded information bits of the ith sub-block is J, the encoded information bit of the ith sub-block is $r_i$, the size of the P-matrix set corresponding to the ith sub-block is $S_{P,i}$, and the size of the b-vector set corresponding to the ith sub-block is $S_{b,i}$. The size of the P-matrix set corresponding to the ith sub-block and the size of the b-vector set corresponding to the ith sub-block are determined by the length of the encoded information bits of the ith sub-block. The size of the P-matrix set meets the following condition:

$$1 \le S_{P,i} \le 2^{\frac{M(M+1)}{2}};$$

and the size of the b-vector set meets the following condition: $1 \leq S_{b,i} \leq 2^M$. To ensure a relatively low cross-correlation between RM sequences in the RM sequence codebook set that is finally generated by using the RM sequence generation formula, the b-vector complete set $S_{b,i}=2^M$ may be preferably selected, and the quantity of P matrices may be selected as small as possible (that is, a relatively small value may be selected for the size of the P-matrix set). When the length of the encoded information bits of the ith sub-block is greater than M, the size of the P-matrix set is determined by the length of the encoded information bits of the ith sub-block and M, and the size of the b-vector set is determined by M. When the length of the encoded information bits of the ith sub-block is less than M, the size of the P-matrix set is 1, and the size of the b-vector set is determined by the length of the encoded information bits of the ith sub-block. In an example solution, the size of the P-matrix set and the size of the b-vector set may be determined based on the following solution:

When $J \geq M$, $S_{b,i}=2^M$, and $S_{P,i}=2^{J-M}$; or when $J < M$, $S_{b,i}=2^J$, and $S_{P,i}=2^0=1$;

where J is used to indicate the length of the encoded information bits of the ith sub-block, M is used to indicate an order of a binary symmetric matrix of an RM sequence, $S_{b,i}$ is used to indicate the size of the b-vector set, and $S_{P,i}$ is used to indicate the size of the P-matrix set. In this embodiment, when the length of the encoded information bits of the ith sub-block is equal to M, the size of the P-matrix set and the size of the b-vector set are determined in the following manner: In a possible implementation, the size of the P-matrix set is determined based on the length of the encoded information bits of the ith sub-block and M, and the size of the b-vector set is determined by M. In another implementation, the size of the P-matrix set is 1, and the size of the b-vector set is determined by the length of the encoded information bits of the ith sub-block. That is, when the length of the encoded information bits of the ith sub-block is equal to M, any possible implementation may be selected according to an actual situation to calculate the size of the P-matrix set and the size of the b-vector set. Determining the size of the P-matrix set and the size of the b-vector set by using the foregoing solution can ensure a relatively low cross-correlation between sequences in an RM sequence codebook that is finally generated by using an RM sequence generation formula.

In another possible implementation, the user equipment determines the size of the P-matrix set and the size of the b-vector set based on the information bit length of the ith sub-block. In an example solution, the information bit length of the ith sub-block is recorded as $B_i$, i=1, 2, . . . , n (it may be understood that the information bit length of the ith sub-block herein is a length occupied by all information bits of the ith sub-block), the information bits of the ith sub-block are $w_i$ (it may be understood that the information bits of the ith sub-block herein are used to indicate the information bits occupied by the current user equipment on the ith sub-block in this embodiment, and in actual application, one sub-block may carry information bits of a plurality of active user equipments), the size of the P-matrix set corresponding to the ith sub-block is $S_{P,i}$, and the size of the b-vector set corresponding to the ith sub-block is $S_{b,i}$. In an example solution, if the information bits of the first user equipment in the ith sub-block are 011011, the information bit length of the ith sub-block is 6. The size of the P-matrix set corresponding to the ith sub-block and the size of the b-vector set corresponding to the ith sub-block are determined by the information bit length of the ith sub-block. The size of the P-matrix set meets the following condition:

$$1 \leq S_{P,i} \leq 2^{\frac{M(M+1)}{2}};$$

and the size of the b-vector set meets the following condition: $1 \leq S_{b,i} \leq 2^M$. To ensure a relatively low cross-correlation between RM sequences in the RM sequence codebook set that is finally generated by using the RM sequence generation formula, the b-vector complete set $S_{b,i}=2^M$ may be preferably selected, and the quantity of P matrices may be selected as small as possible (that is, a relatively small value may be selected for the size of the P-matrix set). When the information bit length of the ith sub-block is greater than or equal to M, the size of the P-matrix set is determined by a difference between the information bit length of the ith sub-block and M, and the size of the b-vector set is determined by M; or when the information bit length of the ith sub-block is less than M, the size of the P-matrix set is 1, and the size of the b-vector set is determined by the information bit length of the ith sub-block. In an example solution, the size of the P-matrix set and the size of the b-vector set may be determined based on the following solution:

When $B_i \geq M$, $S_{b,i}=2^M$, and $S_{P,i}=2^{B_i-M}$; or when $B_i < M$, $S_{b,i}=2^{B_i}$, and $S_{P,i}=2^0=1$;

where $B_i$ is used to indicate the information bit length of the ith sub-block, M is used to indicate an order of a binary symmetric matrix of an RM sequence, $S_{b,i}$ is used to indicate the size of the b-vector set, and $S_{P,i}$ is used to indicate the size of the P-matrix set. In this embodiment, when the information bit length of the ith sub-block is equal to M, a manner of determining the size of the P-matrix set and the size of the b-vector set is as follows: In a possible implementation, the size of the P-matrix set may be determined based on a difference between the information bit length of the ith sub-block and M, and the size of the b-vector set is determined by M. In another implementation, the size of the P-matrix set is 1, and the size of the b-vector set is determined by the information bit length of the ith sub-block. That is, when the information bit length of the ith sub-block is equal to M, any possible implementation may be selected according to an actual situation to calculate the size of the P-matrix set and the size of the b-vector set. In an example solution, assuming that M=6 and $B_i=10$, the size of the b-vector set is $S_{b,i}=2^M=2^6=64$, and the size of the P-matrix set is $S_{P,i}=2^{B_i-M}=2^4=16$. If M=6 and $B_i=5$, the size of the b-vector set is $S_{b,i}=2^{B_i}=2^5=32$, the user equipment specifies one P matrix, and the size of the P-matrix set is 1. If M=6 and $B_i=6$, the size of the b-vector set is $S_{b,i}=2^{B_i}=2^6=64$, the user equipment specifies one P matrix, and the size of the P-matrix set is 1. In addition, the size of the b-vector set may also be $S_{b,i}=2^M=2^6=64$, and the size of the P-matrix set is $S_{P,i}=2^{B_i-M}=2^0=1$.

In this embodiment, to reduce a detection difficulty of the network device, when the sub-blocks are obtained through division, it may be designed that information bit lengths of the sub-blocks decrease sequentially, that is, $B_1 > B_2 > \ldots > B_n$ is met. That is, the size of the P-matrix set of a next sub-block decreases, and the size of the b-vector set also decreases.

303. The user equipment generates a P-matrix set based on M, the size of the P-matrix set, and an information bit set, and generates a b-vector set based on M, the size of the b-vector set, and the information bit set.

To establish a cascading relationship between the sub-blocks, the information bit set includes encoded information bits of at least one of the first sub-block to the ith sub-block. The user equipment generates elements of the P-matrix set based on M, the size of the P-matrix set, and the information bit set, and generate elements of the b-vector set based on M, the size of the b-vector set, and the information bit set; and finally, the user equipment generates the P-matrix set and the b-vector set based on preset filling.

In an example solution, the user equipment may generate a binary vector of the P-matrix set based on M, the size of the P-matrix set, and the encoded information bits of the first sub-block to the (i−1)th sub-block by using a generation formula, and generate a binary vector of the b-vector set based on M, the size of the P-matrix set, and the encoded information bits of the first sub-block to the (i−1)th sub-block by using the generation formula. The generation formula for generating elements of the P-matrix set is as follows:

f(r)=Gr, where f(r) is used to indicate a binary vector of the P-matrix set, and the length of the binary vector meets $$\frac{M(M+1)}{2} * S_{P,i} \text{ or } \frac{M(M-1)}{2} * S_{P,i},$$

where $S_{P,i}$ is used to indicate the size of the P-matrix set, M is used to indicate an order of a binary symmetric matrix of an RM sequence, G is a generator matrix, r is used to indicate an encoded information bit set of the first sub-block to the (i−1)th sub-block, and $$\frac{M(M-1)}{2} * S_{P,i}$$

is used to indicate a length of the binary vector when the P matrix is a matrix whose diagonal elements are all 0s;

The generation formula for generating the elements of the b-vector set is as follows:

f(r)=Gr, where f(r) is used to indicate a binary vector of the b-vector set, and the length of the binary vector meets $M*S_{b,i}$, where $S_{b,i}$ is used to indicate the size of the b-vector set, M is used to indicate an order of a binary symmetric matrix of an RM sequence, G is a generator matrix, and r is used to indicate the encoded information bit set of the first sub-block to the (i−1)th sub-block.

In an example solution, it is assumed that the ith sub-block is a fourth sub-block, information bits of the first sub-block are 0110100011, and an information bit length of the first sub-block is 10; information bits of the second sub-block are 0101001100, and an information bit length of the second sub-block is 10; information bits of the third sub-block are 1001010100, and an information bit length of the third sub-block is 10; and information bits of the fourth sub-block are 1010010010, and the information bit length of the fourth sub-block is 10. Because M is 6, a size of the P-matrix set corresponding to the fourth sub-block is $S_{P,i}=2^{B_i-M}=2^4=16$, and a size of the b-vector set is $S_{b,i}=2^M=2^6=64$. Because the size of the b-vector set is a maximum value, the b-vector set may be obtained by traversing a 6-order vector formed by 0 and 1, that is, the b vector includes (000000, 000001, 000010, . . . , 111111). A size of the P-matrix set is 16. Because the P-matrix is a binary symmetric matrix, each P-matrix needs a maximum of $$\frac{M(M+1)}{2} = \frac{6(6+1)}{2} = 21$$

elements (each element is 0 or 1). In this case, a total of 336 bits are used to generate the elements of the P-matrix set. Information bits of the first sub-block to the third sub-block, that is, a total of 30 bits (that is, 011010001101010011001001010100) are encoded (that is, by using a generation formula) to generate 336 bits, so as to obtain corresponding elements of the P-matrix set. Then, the user equipment generates the P-matrix set from the 336 bits according to a preset filling rule, with every 21 elements forming a group. It may be understood that if the P matrix is a binary symmetric matrix whose diagonal is zero, each P matrix needs only $$\frac{M(M-1)}{2} = \frac{6(6-1)}{2} = 15$$

elements. In this embodiment, the preset filling rule may be filling by row, by column, or by diagonal. In an example solution, the user equipment fills the P matrix by row. In this case, a filling order of the P matrix may be shown in FIG. 2a. In a solid box, filling is performed based on 21 elements; and in a dashed box, filling is performed based on a binary symmetry rule.

It may be understood that, in the foregoing solution, specific implementations of generating the elements of the P-matrix set or the elements of the b-vector set by using the generator matrix include the following several possible implementations.

In a possible implementation, the user equipment constructs a low-density parity-check (LDPC) code of a corresponding bit rate, and performs encoding to obtain the elements of the P-matrix set and the elements of the b-vector set.

In another possible implementation, the user equipment uses LDPC code of any code rate to obtain the elements of the P-matrix set and the elements of the b-vector set through puncturing or repetition.

It may be understood that the foregoing solution is merely an example solution, and the user equipment may alternatively perform encoding by using repetition code, polar code, or BCH code.

304. The user equipment determines a first P matrix from the P-matrix set based on encoded information bit information of the ith sub-block, and determines a first b vector from the b-vector set, where the information bit information of the ith sub-block includes the information bits of the ith sub-block and the information bit length of the ith sub-block.

After obtaining the P-matrix set and the b-vector set, the user equipment obtains an index value of the P matrix in the P-matrix set, and obtains an index value of the b vector in the b-vector set; and then determines the first P matrix and the first b vector based on the length of the encoded information bits of the ith sub-block and the encoded information bits, the index value of the P matrix in the P-matrix set, and the index value of the b vector in the b-vector set.

Optionally, the user equipment may obtain the index value of the P matrix in the P-matrix set in the following several possible implementations.

In a possible implementation, the P matrix is numbered as a decimal number in a generation order of the P matrix. For example, an index value of a first generated P matrix is 0, an index value of a second generated P matrix is 1, . . . , and an index value of an $S_{P,i}$th generated P matrix is $S_{P,i}-1$.

In another possible implementation, the elements of the P matrix are converted into decimal numbers, and the decimal numbers are sorted in descending or ascending order, and then are numbered sequentially. In an example solution, if the P-matrix set includes six P matrices, and elements of the P matrices are respectively (25, 30, 45, 58, 97, 12) after being converted into decimal data, corresponding index values are obtained after sorting in descending order.

In another possible implementation, an element in the P matrix is directly used as the index value of the P matrix.

Similarly, the user equipment may also generate the index value of each b vector in the b-vector set by using the foregoing solution. Details are not described herein again.

After generating the index value of the P matrix and the index value of the b vector, the user equipment establishes a mapping relationship between the ith sub-block and the first P matrix and the first b vector based on the encoded information bit information of the ith sub-block (that is, the encoded information bits of the ith sub-block and the length of the encoded information bits of the ith sub-block).

In an example solution, the user equipment selects the bit value x and the bit value y based on the encoded information bit information of the ith sub-block, where the bit value x and the bit value y cover the encoded information bits of the ith sub-block; and the user equipment determines the first P matrix based on the bit value x, and determines the first b vector based on the bit value y. In this embodiment, that the bit value x and the bit value y cover the encoded information bits of the ith sub-block is used to indicate that the bit value x and the bit value y include all the encoded information bits of the ith sub-block. In an example solution, if the encoded information bits of the ith sub-block are 101100, the bit value x may be 1011, and the bit value y may be 1100. Similarly, the bit value x may also be 10110, and the bit value y may be 1100.

In the foregoing solution, an information bit length of the bit value x is less than or equal to an encoded information bit length of the ith sub-block and is greater than 0, and an index value indicated by the bit value x does not exceed an index value corresponding to the P-matrix set; and an information bit length of the bit value y is less than or equal to an encoded information bit length of the ith sub-block and is greater than 0, and an index value indicated by the bit value y does not exceed an index value corresponding to the b-vector set. In an example solution, the bit value x and the bit value y meet the following conditions: $0<x \le B_i$ and $2^x \le S_{P,i}$, and $0<y \le B_i$ and $2^y \le S_{b,i}$, where J is used to indicate the encoded information bit length of the ith sub-block, $S_{P,i}$ is used to indicate a size of a P-matrix set corresponding to the ith sub-block, and $S_{P,i}$ is used to indicate a size of a b-vector set corresponding to the ith sub-block.

Based on the foregoing solution, a specific operation of determining, by the user equipment, the first P matrix based on the bit value x, and determining the first b vector based on the bit value y may be as follows.

In a possible implementation, the user equipment determines the first P matrix from the P-matrix set based on the bit value x and a first index relationship, where the first index relationship is used to indicate a correspondence between an information bit of the ith sub-block and a P matrix in the P-matrix set; the user equipment determines the first b vector from the b-vector set based on the bit value y and a second index relationship, where the second index relationship is used to indicate a correspondence between an information bit of the ith sub-block and a b vector in the b-vector set.

In this embodiment, the first index relationship may be a preset mapping relationship or a mapping relationship obtained through calculation based on the bit value x, and the second index relationship may be a preset mapping relationship or a mapping relationship obtained through calculation based on the bit value y.

In an example solution, the user equipment sets a mapping relationship, and determines that the bit value x corresponds to the first P matrix and that the bit value y corresponds to the first b vector.

In another example solution, the user equipment converts the bit value x into a value that has a same counting manner as the index value of the P matrix, and then determines the first P matrix based on a preset rule and the value corresponding to the bit value x. In addition, the user equipment converts the bit value y into a value that has a same counting manner as the index value of the b vector, and then determines the first b vector based on the preset rule and the value corresponding to the bit value y. It may be understood that the preset rule is that a P matrix corresponding to an index value that is the same as the value corresponding to the bit value x is selected as the first P matrix, and a b vector corresponding to the index value that is the same as the value corresponding to the bit value y is selected as the first b vector; or the preset rule is that a P matrix corresponding to an index value that differs from the value corresponding to the bit value x by a fixed preset value is selected as the first P matrix, and a b vector corresponding to an index value that differs from the value corresponding to the bit value y by a fixed preset value is selected as the first b vector. Diversified rules may be preset, and the preset rule is not specifically limited herein, provided that the first index relationship and the second index relationship are established. For example, the index value of the P matrix in the P-matrix set is a decimal value and is numbered from 0, and the index value of the b vector in the b-vector set is a decimal value and is encoded from 0. A decimal value converted from the bit value x is 6, and a decimal value converted from the bit value y is 8. In this case, the first P matrix is a P matrix whose index value is 6, and the first b vector is a b vector whose index value is 8.

305. The user equipment generates, based on the first P matrix and the first b vector, the RM sequence corresponding to the ith sub-block.

After obtaining the first P matrix and the first b vector, the user equipment generates the RM sequence based on the RM sequence generation formula $$\phi_{P,b}(j)=A*i^{(2b+Pa_{j-1})^T a_{j-1}}.$$

306. The user equipment outputs the RM sequence corresponding to the ith sub-block to the network device.

Figure 3A:
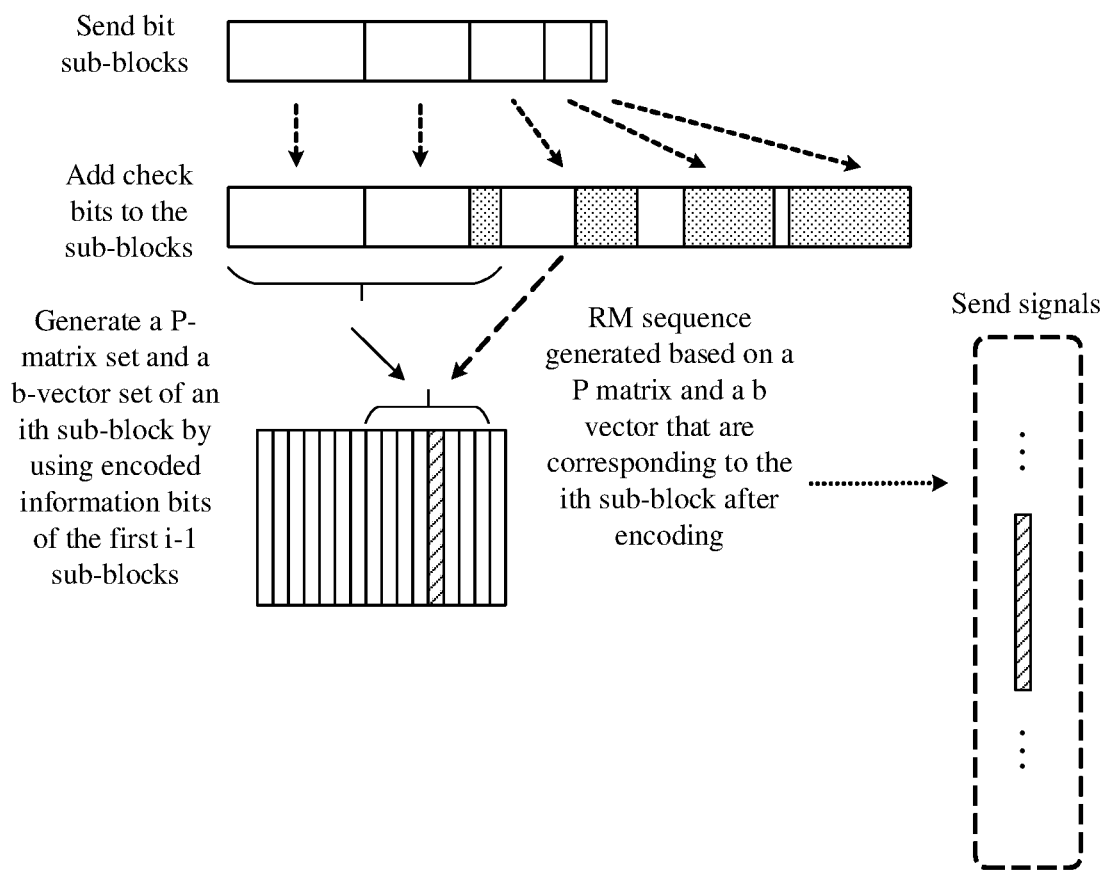
FIG. 3*a* is another schematic diagram of outputting an RM sequence according to an embodiment of this application.

In an example solution, that the user equipment outputs the RM sequence to the network device may be shown in FIG. 3a. An RM sequence set of the ith sub-block is generated based on information bits of the first (i−1) sub-blocks; and then a corresponding RM sequence is selected from the RM sequence set, and is output to the network device.

307. The network device obtains the first P matrix and the first b vector based on the RM sequence.

After receiving the RM sequence, the network device obtains, based on an RM sequence detection algorithm, the first P matrix and the first b vector that are used to generate the RM sequence.

In this embodiment, the RM sequence detection algorithm may be a detection algorithm of a fast user detection framework based on successive signal cancellation. A specific implementation process is not described herein again.

308. The network device obtains the information bits of the ith sub-block based on the first P matrix and the first b vector.

The network device obtains the bit value x corresponding to the first P matrix and the bit value y corresponding to the first b vector through calculation based on the first P matrix, the first b vector, the first index relationship determined through negotiation, and the second index relationship; and finally restores the information bits of the ith sub-block based on the bit value x and the bit value y, and a rule selected for generating the bit value x and the bit value y.

This embodiment provides only a process of sending an RM sequence by one active user equipment on one sub-block, but an active user equipment on another sub-block and a plurality of active user equipments on one sub-block all send the RM sequence in the foregoing manner. Details are not described herein again.

In this embodiment, a P-matrix set and a b-vector set are dynamically generated for each sub-block, thereby reducing storage overheads of the user equipment. In addition, the P-matrix set of each sub-block is generated based on the information bits of the sub-block preceding the current sub-block, thereby improving the cascading relationship between the sub-blocks and improving detection correctness. In this embodiment, check bits are further added to each sub-block, where the check bits are also obtained based on the information bits of the sub-block. In this way, a cascading relationship between sub-blocks is further increased, thereby improving detection correctness.

Figure 4:
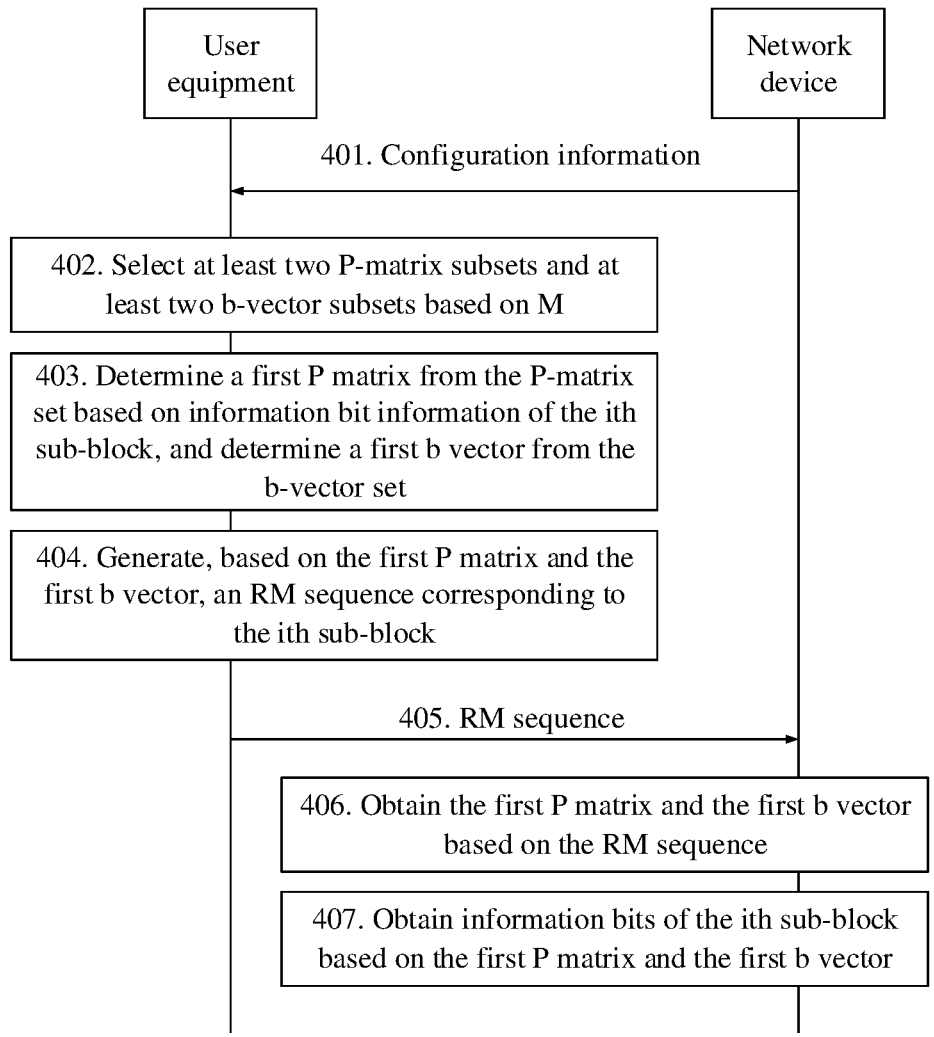
FIG. 4 is a schematic diagram of another embodiment of a data transmission method according to an embodiment of this application.

Specifically, referring to FIG. 4, an embodiment of a data transmission method in embodiments of this application includes the following steps.

401. A user equipment receives configuration information sent by a network device, where the configuration information is used to indicate a matrix order M, M is a matrix order of an RM sequence corresponding to the user equipment in an ith sub-block, and M and i are positive integers.

The user equipment receives the configuration information sent by the network device, where the configuration information is used to indicate the matrix order M, and the order M is a matrix order of the RM sequence corresponding to the user equipment in the ith sub-block.

In this embodiment, the RM sequence is generated by using the P matrix and the b vector based on a generation formula, where the generation formula may be:

$$\phi_{P,b}(j) = A * i^{(2b + Pa_{j-1})^T a_{j-1}};$$

where $\phi_{P,b}(j)$ is a value of a jth element in the second-order RM sequence, A is an amplitude normalization factor, $i^2 = -1$, P is a binary symmetric matrix with M rows and M columns, b is a binary vector with a length of M, and $a_{j-1}$ is a binary vector with a length of M, which is converted from an integer value j−1. It can be seen from the generation formula of the RM sequence that, for each fixed P matrix (which may be compared to a root of a ZC sequence), changing a value of the b vector may generate space of 2 to the power of M orthogonal RM sequences. RM sequences constructed using different P matrices are non-orthogonal. It may be understood that the binary symmetric matrix in this embodiment is a symmetric matrix formed by only two types of elements: 0 and 1, and the binary vector is a vector value formed by only two types of elements: 0 and 1. In this embodiment, although the P matrix and the b vector are used in the RM sequence generation formula to name the matrix and the vector that are used to generate the RM sequence, the P matrix and the b vector are merely example descriptions. Actually, the matrix and the vector that are used to generate the RM sequence may be named in another manner. Therefore, the P-matrix set and the b-vector set in this embodiment are merely example descriptions, and another naming manner may also be used. This is not limited herein.

It may be understood that, in this embodiment of this application, the network device may directly add M to the configuration information, that is, the network device directly specifies the order M; or the network device adds the time-frequency resource indication information to the configuration information, and then the user equipment determines M based on the quantity of available time-frequency resources indicated by the time-frequency resource indication information. The time-frequency resource indication information may be used to indicate a quantity of resource elements for sending the reference signal sequence, or used to indicate a resource pattern for sending the reference signal sequence, or used to indicate a time-frequency resource for sending the parameter signal sequence, provided that the time-frequency resource indication information can be used to indicate the quantity of available time-frequency resources for sending the RM sequence. Specific indication information is not limited herein. In an example solution, when determining M based on the quantity of available time-frequency resources, the user equipment may obtain a difference between 2 to the power of N and the quantity of available time-frequency resources, and use N that minimizes the difference between the two as M. For example, if the quantity of available time-frequency resources is 72, 2 to the power of 6 is 64, and 2 to the power of 57 is 128. A difference between 64 and 72 is 8, and a difference between 128 and 72 is 72. Therefore, M is 4. It may be understood that the length of the RM sequence is equal to 2 to the power of M. Therefore, after M is determined by using the foregoing solution, the length of the RM sequence is also determined. In a transmission process, when the length of the RM sequence is less than the quantity of available time-frequency resources, some bits in the RM sequence may be repeatedly carried on a redundant time-frequency resource, so that the length of the RM sequence is supplemented to the quantity of available time-frequency resources; or when the length of the RM sequence is greater than the quantity of available time-frequency resources, some bits in the RM sequence may be truncated, so that the length of the RM sequence is equal to the quantity of available time-frequency resources. In this embodiment, a plurality of manners may be used to select some bits in the RM sequence to be repeatedly carried on the time-frequency resource or truncated, for example, some unimportant bits may be randomly selected or selected. This is not specifically limited herein.

402. The user equipment selects at least two P-matrix subsets and at least two b-vector subsets based on M, where the at least two P-matrix subsets are used as the P-matrix set, and the at least two b-vector subsets are used as the b-vector set.

The user equipment obtains a complete P-matrix set (that is, a maximum value of a size of the P-matrix set is used) based on M, and then selects some P matrices from the complete P-matrix set as the P-matrix subset. Similarly, the user equipment also selects the b-vector subset in the same manner. It may be understood that, in this embodiment, there are at least two P-matrix subsets, and there are at least two b-vector subsets. In an example solution, the P-matrix subset may be obtained from a complete P-matrix set, and each P-matrix in the P-matrix subset is a binary symmetric matrix with M rows and M columns. Similarly, the b-vector subset is also obtained from the complete b-vector set, and each b vector in the b-vector subset is a binary vector with a length of M. A criterion for selecting the P-matrix subset is that cross-correlation between RM sequences generated based on different b vectors corresponding to P matrices in the P-matrix subset is as low as possible. For selection of the P-matrix set and the b-vector set, the b-vector set may be preferentially fully used, and the quantity of P matrices may be selected as small as possible, to ensure that sequences in the RM sequence codebook that is finally generated by using the RM sequence generation formula have a relatively low cross-correlation.

403. The user equipment determines a first P matrix from the P-matrix set based on the information bit information of the ith sub-block, and determines a first b vector from the b-vector set, where the information bit information of the ith sub-block includes the information bits of the ith sub-block and the information bit length of the ith sub-block.

After obtaining the P-matrix subset and the b-vector subset, the user equipment obtains an index value of the P-matrix subset and an index value of the b-vector subset; then the user equipment obtains an index value of a P matrix in the P-matrix subset, and obtains an index value of a b vector in the b-vector subset; then determines the first P-matrix subset and the first b-vector subset based on the information bit length of the ith sub-block, the information bit, the index value of the P-matrix subset, and the index value of the b-vector subset; and finally, determines the first P matrix and the first b vector based on the information bit length of the ith sub-block, the information bit, the index value of the P matrix in the first P-matrix subset, and the index value of the b vector in the first b-vector subset.

Optionally, the index value of the P-matrix subset and the index value of the b-vector subset that are obtained by the user equipment may be binary numbers, decimal numbers, or in another numbering manner.

Based on the foregoing solution, the user equipment may determine the first P-matrix subset based on the information bits of the ith sub-block and a third index relationship, and determine the first b-vector subset based on the information bits of the ith sub-block and a fourth index relationship. The third index relationship is used to indicate a mapping relationship between the ith sub-block and the P-matrix subset, and the fourth index relationship is used to indicate a mapping relationship between the ith sub-block and the b-vector subset. In an example solution, a quantity of P-matrix subsets is 2, and index values are 0 and 1; and a quantity of b-vector subsets is 2, and index values are 1 and 0. The third index relationship may be a cascading mapping function between the P-matrix subset and the information bits of the ith sub-block, and the cascading mapping function is as follows:

$$f(\boldsymbol{W}_i) = f(\boldsymbol{W}_{i-1}) + \sum_{j=1}^{J-M} \boldsymbol{W}_{i-1}, 其中, f(\boldsymbol{W}_1) = 0.$$

That is, values of the cascading mapping function are only 0 and 1, that is, correspond to index values of the P-matrix subset. For each sub-block, the values of the cascade mapping function are first calculated to determine the P-matrix subset. Similarly, the fourth index relationship is also calculated in the same manner, and details are not described herein again. If the b-vector complete set is selected as the b vectors, a b vector index mapping calculation process may be omitted.

Optionally, the user equipment may obtain the index value of the P matrix in the first P-matrix subset in the following several possible implementations.

In a possible implementation, the P matrix is numbered as a decimal number in a generation order of the P matrix in the first P-matrix subset. For example, an index value of a first generated P matrix is 0, an index value of a second generated P matrix is 1, . . . , and an index value of an $S_{P,i}$th generated P matrix is $S_{P,i}-1$.

In another possible implementation, elements of the P matrix in the first P-matrix subset are converted into decimal numbers, and the decimal numbers are sorted in descending or ascending order, and then are numbered sequentially. In an example solution, if the P-matrix set includes six P matrices, and elements of the P matrices are respectively (25, 30, 45, 58, 97, 12) after being converted into decimal data, corresponding index values are obtained after sorting in descending order.

In another possible implementation, an element in the P matrix is directly used as the index value of the P matrix.

Similarly, the user equipment may also generate the index value of each b vector in the b-vector set by using the foregoing solution. Details are not described herein again.

After generating the index value of the P matrix in the first P-matrix subset and the index value of the b-vector in the first b-vector subset, the user equipment establishes a mapping relationship between the ith sub-block and the first P matrix and the ith sub-block and the first b vector according to information bit information of the ith sub-block (that is, information bits of the ith sub-block and an information bit length of the ith sub-block).

In an example solution, the user equipment selects the bit value x and the bit value y based on the information bit information of the ith sub-block, where the bit value x and the bit value y cover the information bits of the ith sub-block; and the user equipment determines the first P-matrix based on the bit value x, and determines the first b vector based on the bit value y. In this embodiment, that the bit value x and the bit value y cover the information bits of the ith sub-block is used to indicate that the bit value x and the bit value y include all the information bits of the ith sub-block. In an example solution, if the information bits of the ith sub-block are 101100, the bit value x may be 1011, and the bit value y may be 1100. Similarly, the bit value x may also be 10110, and the bit value y may be 1100.

In the foregoing solution, an information bit length of the bit value x is less than or equal to the information bit length of the ith sub-block and is greater than 0, and an index value indicated by the bit value x does not exceed an index value corresponding to the P-matrix set; and an information bit length of the bit value y is less than or equal to the information bit length of the ith sub-block and is greater than 0, and an index value indicated by the bit value y does not exceed an index value corresponding to the b-vector set. In an example solution, the bit value x and the bit value y meet the following conditions: $0<x\leq B_i$ and $2^x\leq S_{P,I}$ and $0<y\leq B_i$ and $2^y\leq S_{b,i}$, where $B_i$ is used to indicate the information bit length of the ith sub-block, $S_{P,i}$ is used to indicate a size of a P-matrix set corresponding to the ith sub-block, and $S_{b,i}$ is used to indicate a size of a b-vector set corresponding to the ith sub-block.

Based on the foregoing solution, a specific operation of determining, by the user equipment, the first P matrix based on the bit value x, and determining the first b vector based on the bit value y may be as follows.

In a possible implementation, the user equipment determines the first P matrix from the P-matrix set based on the bit value x and a first index relationship, where the first index relationship is used to indicate a correspondence between an information bit of the ith sub-block and a P matrix in the P-matrix set; the user equipment determines the first b vector from the b-vector set based on the bit value y and a second index relationship, where the second index relationship is used to indicate a correspondence between an information bit of the ith sub-block and a b vector in the b-vector set.

In this embodiment, the first index relationship may be a preset mapping relationship or a mapping relationship obtained through calculation based on the bit value x, and the second index relationship may be a preset mapping relationship or a mapping relationship obtained through calculation based on the bit value y.

In an example solution, the user equipment sets a mapping relationship, and determines that the bit value x corresponds to the first P matrix and that the bit value y corresponds to the first b vector.

In another example solution, the user equipment converts the bit value x into a value that has a same counting manner as the index value of the P matrix, and then determines the first P matrix based on a preset rule and the value corresponding to the bit value x. In addition, the user equipment converts the bit value y into a value that has a same counting manner as the index value of the b vector, and then determines the first b vector based on the preset rule and the value corresponding to the bit value y. It may be understood that the preset rule is that a P matrix corresponding to an index value that is the same as the value corresponding to the bit value x is selected as the first P matrix, and a b vector corresponding to the index value that is the same as the value corresponding to the bit value y is selected as the first b vector; or the preset rule is that a P matrix corresponding to an index value that differs from the value corresponding to the bit value x by a fixed preset value is selected as the first P matrix, and a b vector corresponding to an index value that differs from the value corresponding to the bit value y by a fixed preset value is selected as the first b vector. Diversified rules may be preset, and the preset rule is not specifically limited herein, provided that the first index relationship and the second index relationship are established. For example, the index value of the P matrix in the P-matrix set is a decimal value and is numbered from 0, and the index value of the b vector in the b-vector set is a decimal value and is encoded from 0. A decimal value converted from the bit value x is 6, and a decimal value converted from the bit value y is 8. In this case, the first P matrix is a P matrix whose index value is 6, and the first b vector is a b vector whose index value is 8.

In the foregoing solution, the first P matrix and the first b vector are obtained based on the information bits and the information bit length of the ith sub-block to which no check bit is added. If check bits are added to the ith sub-block, the foregoing solution may also be replaced with encoded information bits of the ith sub-block and the length of the encoded information bits. A specific manner is not described herein again.

404. The user equipment generates, based on the first P matrix and the first b vector, the RM sequence corresponding to the ith sub-block.

After obtaining the first P matrix and the first b vector, the user equipment generates the RM sequence based on the RM sequence generation formula $$\phi_{P,b}(j) = A * i^{(2b+Pa_{j-1})^T a_{j-1}}.$$

405. The user equipment outputs the RM sequence corresponding to the ith sub-block to the network device.

In an example solution, that the user equipment outputs the RM sequence to the network device may be shown in FIG. 2b. An RM sequence set of the ith sub-block is generated based on information bits of the first (i−1) sub-blocks; and then a corresponding RM sequence is selected from the RM sequence set, and is output to the network device.

406. The network device obtains the first P matrix and the first b vector based on the RM sequence.

After receiving the RM sequence, the network device obtains, based on an RM sequence detection algorithm, the first P matrix and the first b vector that are used to generate the RM sequence.

In this embodiment, the RM sequence detection algorithm may be a detection algorithm of a fast user detection framework based on successive signal cancellation. A specific implementation process is not described herein again.

407. The network device obtains the information bits of the ith sub-block based on the first P matrix and the first b vector.

The network device obtains the bit value x corresponding to the first P matrix and the bit value y corresponding to the first b vector through calculation based on the first P matrix, the first b vector, the first index relationship determined through negotiation, and the second index relationship; and finally restores the information bits of the ith sub-block based on the bit value x and the bit value y, and a rule selected for generating the bit value x and the bit value y.

Optionally, when the information bit information of the ith sub-block in this embodiment indicates the encoded information bits and the length of the encoded information bits, in this embodiment, the user equipment may obtain the first P matrix and the first b vector and establish the first index relationship and the second index relationship by using the method shown in FIG. 3. Details are not described herein again.

The embodiments shown in FIG. 2 to FIG. 4 provide only a process of sending an RM sequence by one active user equipment on one sub-block, but an active user equipment on another sub-block and a plurality of active user equipments on one sub-block all send the RM sequence in the foregoing manner. Details are not described herein again.

In this embodiment, each sub-block determines the generator matrix and the vector of the RM sequence based on the at least two P-matrix subsets and the at least one b-vector subset. In this way, calculation overheads of the user equipment can be reduced. In addition, the P-matrix subset and the b-vector subset meet a condition of relatively low cross-correlation, so that detection correctness can also be improved.

The following describes the data transmission method in this embodiment of this application by using a specific application scenario.

Figure 5:
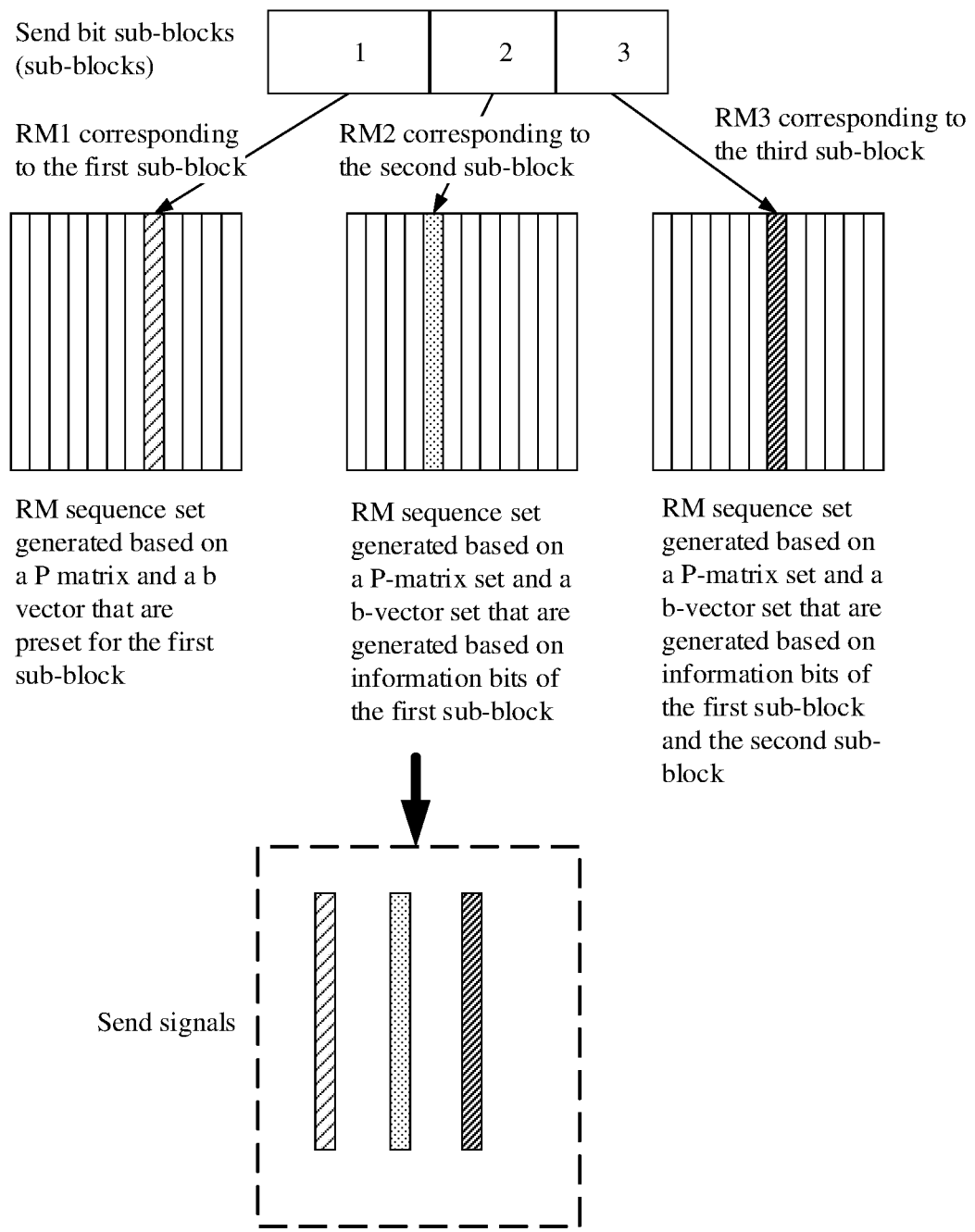
FIG. 5 is another schematic diagram of outputting an RM sequence according to an embodiment of this application.

The information sent by the first user equipment is divided into three sub-blocks for transmission, where information bits of the first sub-block are 010010, information bits of the second sub-block are 100101, and information bits of the third sub-block are 100111. An information bit length of the first sub-block is 6, an information bit length of the second sub-block is 6, and an information bit length of the third sub-block is 6. The configuration information sent by the base station and received by the first user equipment indicates that a matrix order of the first user equipment in the first sub-block is 6, a matrix order of the first user equipment on the second sub-block is 8, and a matrix order of the first user equipment on the third sub-block is 6. The first user equipment obtains $P_1$ of the first sub-block from a preset 6*6 binary symmetric matrix set, and obtains b1 of the first sub-block from a preset binary vector with a length of 6. Then, the first user equipment outputs the RM sequence corresponding to the first sub-block to the base station. The first user equipment determines, in a second sub-block based on an information bit length of the second sub-block and the matrix order 8, that a size of a P-matrix set corresponding to the second sub-block is $S_{P,i}=2^0=1$ and a size of a b-vector set corresponding to the second sub-block is $S_{b,i}=2^6=64$; then determines the P-matrix set and the b-vector set based on the information bits of the first sub-block; and finally determines P2 and b2 based on the information bits of the first user equipment on the second sub-block, where P2 and b2 are a P matrix and a b-vector for generating the RM sequence corresponding to the second sub-block, and then the first user equipment outputs the RM sequence corresponding to the second sub-block. The first user equipment obtains, in the same manner, P3 and b3 that are corresponding to the third sub-block, where P3 and b3 are a P matrix and a b-vector for generating the RM sequence corresponding to the third sub-block, and then the first user equipment outputs the RM sequence corresponding to the third sub-block. In an example solution, FIG. 5 is a schematic diagram of outputting an RM sequence by a user equipment. The user equipment generates a corresponding RM sequence set for each sub-block (that is, generates a corresponding P-matrix set and a corresponding b-vector set, and then generates an RM sequence set based on the P-matrix set and the b-vector set); and then the user equipment selects a corresponding RM sequence on each sub-block, and outputs the RM sequence to the network device. After receiving the RM sequence in the first sub-block, the base station obtains P1 and b1 by using a detection algorithm, and generates a plurality of groups of bit values x and bit values y corresponding to the first sub-block. The base station calculates a plurality of groups of P-matrix sets and b-vector sets based on a plurality of groups of bit values x and bit values y, and establishes a corresponding index relationship; then, after receiving the RM sequence on the second sub-block, the base station obtains P2 and b2 by using a detection algorithm, determines, based on P2 and b2, the bit value x and the bit value y that are respectively corresponding to P1 and b1 from the plurality of groups of P-matrix sets and b-vector sets, and finally restores the information bits of the first user terminal in the first sub-block based on a rule for generating the bit value x and the bit value y that are determined through negotiation. For P2 and b2 of the second sub-block, a corresponding bit value x and a corresponding bit value y may be determined based on a corresponding index relationship, and finally the information bits of the first user terminal in the second sub-block are restored based on the rule for generating the bit value x and the bit value y that are determined through negotiation. Similarly, the information bits of the first user terminal in the third sub-block are restored in the same manner. In this embodiment, the base station negotiates with the user equipment to determine a rule for establishing an index relationship and a rule for generating the bit value x and the bit value y.

Figure 6:
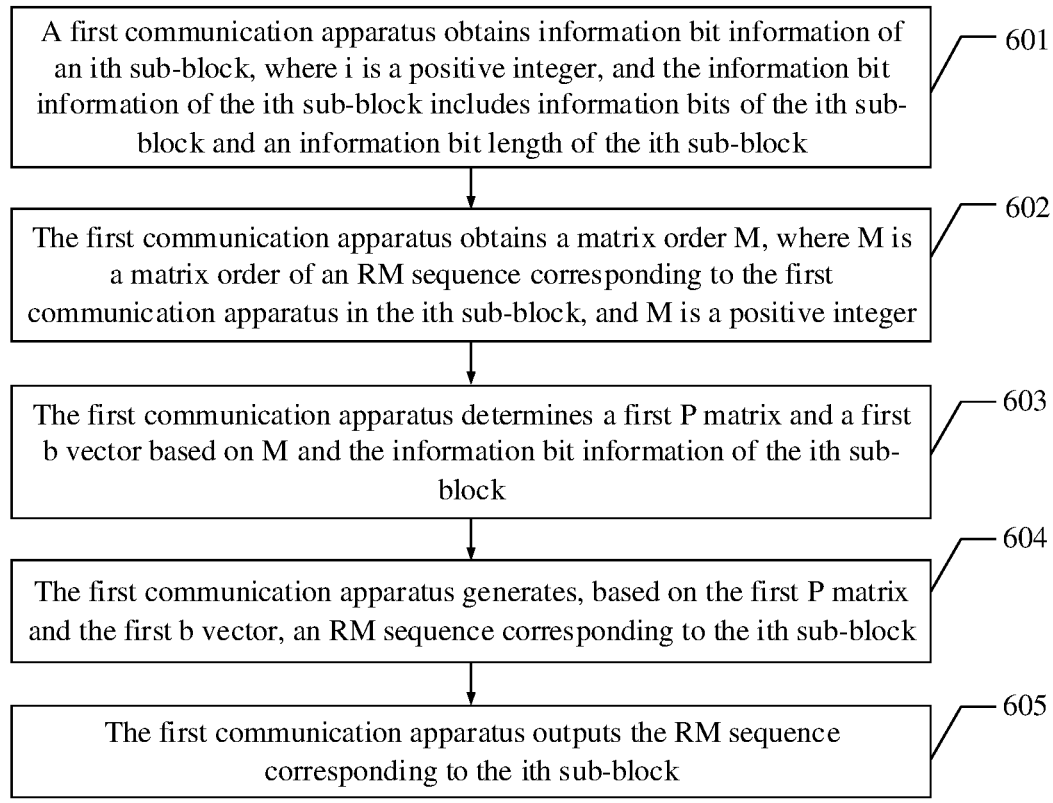
FIG. 6 is a schematic diagram of another embodiment of a data transmission method according to an embodiment of this application.

Specifically, referring to FIG. 6, an embodiment of a data transmission method in embodiments of this application includes the following steps.

601. The first communication apparatus obtains information bit information of an ith sub-block, where i is a positive integer, and the information bit information of the ith sub-block includes information bits of the ith sub-block and an information bit length of the ith sub-block.

When preparing to send data, the first communication apparatus (equivalent to the user equipment in FIG. 2 to FIG. 4) allocates to-be-transmitted data to a plurality of sub-blocks based on a configuration, and determines information bit information of each sub-block. For example, the first communication apparatus allocates to-be-transmitted data to 10 sub-blocks for transmission, where information carried in a fifth sub-block is 0100110. In this case, information bit information of the fifth sub-block is that information bits are 0100110, and an information bit length is 7.

602. The first communication apparatus obtains a matrix order M, where M is a matrix order of an RM sequence corresponding to the first communication apparatus in the ith sub-block, and M is a positive integer.

The first communication apparatus (that is, equivalent to the user equipment in FIG. 2 to FIG. 4) receives configuration information sent by the second communication apparatus (that is, equivalent to the network device in FIG. 2 to FIG. 4), where the configuration information is used to indicate the matrix order M, and the order M is the matrix order of the RM sequence corresponding to the user equipment in the ith sub-block.

In this embodiment, the RM sequence is generated by using the P matrix and the b vector based on a generation formula, where the generation formula may be:

$$\phi_{P,b}(j)=A*i^{(2b+Pa_{j-1})^T a_{j-1}};$$

where $\phi_{P,b}(j)$ is a value of a j jth element in the second-order RM sequence, A is an amplitude normalization factor, $i^2=-1$, P is a binary symmetric matrix with M rows and M columns, b is a binary vector with a length of M, and $a_{j-1}$ is a binary vector with a length of M, which is converted from an integer value j−1. It can be seen from the generation formula of the RM sequence that, for each fixed P matrix (which may be compared to a root of a ZC sequence), changing a value of the b vector may generate space of 2 to the power of M orthogonal RM sequences. RM sequences constructed using different P matrices are non-orthogonal. It may be understood that the binary symmetric matrix in this embodiment is a symmetric matrix formed by only two types of elements: 0 and 1, and the binary vector is a vector value formed by only two types of elements: 0 and 1. In this embodiment, although the P matrix and the b vector are used in the RM sequence generation formula to name the matrix and the vector that are used to generate the RM sequence, the P matrix and the b vector are merely example descriptions. Actually, the matrix and the vector that are used to generate the RM sequence may be named in another manner. Therefore, the P-matrix set and the b-vector set in this embodiment are merely example descriptions, and another naming manner may also be used. This is not limited herein.

It may be understood that, in this embodiment of this application, the second communication apparatus may directly add M to the configuration information, that is, the network device directly specifies the order M; or the network device adds the time-frequency resource indication information to the configuration information, and then the user equipment determines M based on the quantity of available time-frequency resources indicated by the time-frequency resource indication information. The time-frequency resource indication information may be used to indicate a quantity of resource elements for sending the reference signal sequence, or used to indicate a resource pattern for sending the reference signal sequence, or used to indicate a time-frequency resource for sending the parameter signal sequence, provided that the time-frequency resource indication information can be used to indicate the quantity of available time-frequency resources for sending the RM sequence. Specific indication information is not limited herein. In an example solution, when determining M based on the quantity of available time-frequency resources, the user equipment may obtain a difference between 2 to the power of N and the quantity of available time-frequency resources, and use N that minimizes the difference between the two as M. For example, if the quantity of available time-frequency resources is 72, 2 to the power of 6 is 64, and 2 to the power of 7 is 128. A difference between 64 and 72 is 8, and a difference between 128 and 72 is 72. Therefore, M is 4. It may be understood that the length of the RM sequence is equal to 2 to the power of M. Therefore, after M is determined by using the foregoing solution, the length of the RM sequence is also determined. In a transmission process, when the length of the RM sequence is less than the quantity of available time-frequency resources, some bits in the RM sequence may be repeatedly carried on a redundant time-frequency resource, so that the length of the RM sequence is supplemented to the quantity of available time-frequency resources; or when the length of the RM sequence is greater than the quantity of available time-frequency resources, some bits in the RM sequence may be truncated, so that the length of the RM sequence is equal to the quantity of available time-frequency resources. In this embodiment, a plurality of manners may be used to select some bits in the RM sequence to be repeatedly carried on the time-frequency resource or truncated, for example, some unimportant bits may be randomly selected or selected. This is not specifically limited herein.

603. The first communication apparatus determines a first P matrix and a first b vector based on M and the information bit information of the ith sub-block.

In this embodiment, the first communication apparatus may determine the first P matrix and the first b vector by using the method in any one of the embodiments in FIG. 2 to FIG. 4. Details are not described herein again.

604. The first communication apparatus generates, based on the first P matrix and the first b vector, the RM sequence corresponding to the ith sub-block.

In this embodiment, the first communication apparatus may generate the RM sequence corresponding to the ith sub-block by using the method in any one of the embodiments in FIG. 2 to FIG. 4. Details are not described herein again.

605. The first communication apparatus outputs RM sequence corresponding to the ith sub-block.

The foregoing describes the data transmission methods in embodiments of this application, and the following describes a first communication apparatus and a second communication apparatus in embodiments of this application.

Figure 7:
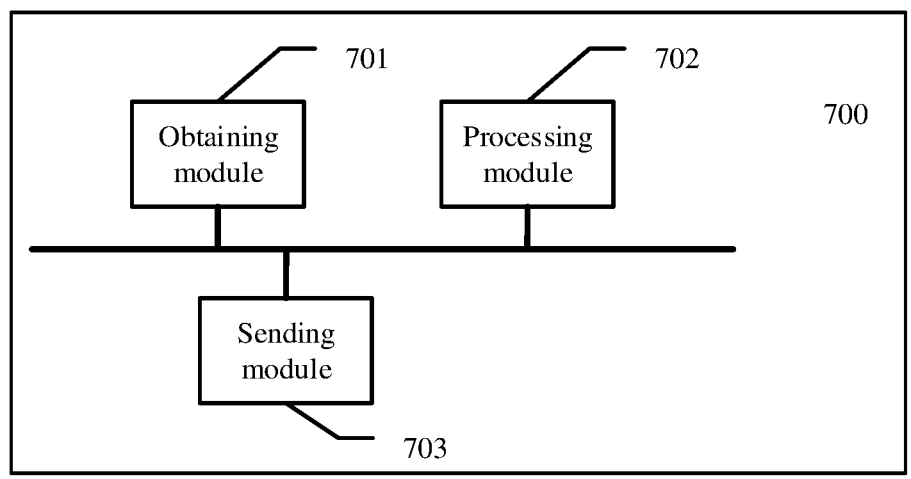
FIG. 7 is a schematic diagram of an embodiment of a first communication apparatus according to an embodiment of this application.

Specifically, referring to FIG. 7, the first communication apparatus 700 in this embodiment of this application includes an obtaining module 701, a processing module 702, and a sending module 703. The obtaining module 701, the processing module 702, and the sending module 703 are connected by using a bus. The first communication apparatus 700 may be the user equipment in the foregoing method embodiments, or may be configured as one or more chips in the user equipment. The first communication apparatus 700 may be configured to perform some or all functions of the user equipment in the foregoing method embodiments.

For example, the obtaining module 701 may be configured to perform step 201, step 301, step 401, or step 601 in the foregoing method embodiments and receive corresponding data. For example, the obtaining module 701 obtains information bit information of an ith sub-block, where i is a positive integer, and the information bit information of the ith sub-block includes information bits of the ith sub-block and an information bit length of the ith sub-block; and obtains a matrix order M, where M is a matrix order of an RM sequence corresponding to the first communication apparatus in the ith sub-block, and M is a positive integer. The processing module 702 may be configured to perform steps 202 to 205, or steps 302 to 305, or steps 402 to 404, or steps 602 to 604 in the foregoing method embodiments. For example, the processing module 702 determines a first P matrix and a first b vector based on M and the information bit information of the ith sub-block; and generates, based on the first P matrix and the first b vector, the RM sequence corresponding to the ith sub-block. The sending module 703 may be configured to perform step 206, step 306, step 405, or step 605 in the foregoing method embodiments. For example, the sending module 703 outputs the RM sequence corresponding to the ith sub-block.

Optionally, the processing module 702 is specifically configured to: obtain a P-matrix set and a b-vector set based on M; and determine the first P matrix from the P-matrix set based on the information bit information of the ith sub-block, and determine the first b vector from the b-vector set.

Optionally, the processing module 702 is specifically configured to: generate a size of the P-matrix set and a size of the b-vector set based on M and the information bit length of the ith sub-block; and generate the P-matrix set and the b-vector set based on M, the size of the P-matrix set, the size of the b-vector set, and an information bit set, where the information bit set includes information bits of at least one of the first sub-block to the ith sub-block.

Optionally, the processing module 702 is specifically configured to: generate a size of the P-matrix set and a size of the b-vector set based on M and a length of encoded information bits of the ith sub-block, where the length of the encoded information bits of the ith sub-block is a sum of a length of check bits after the check bits are added to the ith sub-block and the information bit length of the ith sub-block; and generate the P-matrix set and the b-vector set based on M, the size of the P-matrix set, the size of the b-vector set, and an information bit set.

Optionally, the information bit set includes information bits of at least one of the first sub-block to the ith sub-block; or the information bit set includes at least one of encoded information bits of the first sub-block to encoded information bits of the ith sub-block, and the encoded information bits include check bits and information bits of the sub-block.

Optionally, when the information bit length of the ith sub-block is greater than or equal to M, the size of the P-matrix set is determined by the information bit length of the ith sub-block and M, and the size of the b-vector set is determined by M; or when the information bit length of the ith sub-block is less than M, the size of the P-matrix set is 1, and the size of the b-vector set is determined by the information bit length of the ith sub-block.

Optionally, when the length of the encoded information bits of the ith sub-block is greater than or equal to M, the size of the P-matrix set is determined by the length of the encoded information bits of the ith sub-block and M, and the size of the b-vector set is determined by M; or when the length of the encoded information bits of the ith sub-block is less than M, the size of the P-matrix set is 1, and the size of the b-vector set is determined by the length of the encoded information bits of the ith sub-block.

Optionally, the processing module 702 is specifically configured to: generate elements of all P matrices in the P-matrix set based on M, the size of the P-matrix set, and the information bit set, and generate elements of all b vectors in the b-vector set based on M, the size of the b-vector set, and the information bit set; and generate the P-matrix set according to a preset filling rule and the elements of all P matrices in the P-matrix set, and generate the b-vector set by using a length of the b vector and the elements of all b vectors in the b-vector set.

Optionally, the preset filling rule includes filling the P matrix in a specified direction such as a row, a column, or a diagonal.

Optionally, the processing module 702 is specifically configured to select at least two P-matrix subsets and at least two b-vector subsets based on M, where the at least two P-matrix subsets are used as the P-matrix set, and the at least two b-vector subsets are used as the b-vector set.

Optionally, the processing module 702 is specifically configured to: obtain an index value of each P matrix in the P-matrix set and an index value of each b vector in the b-vector set; select a bit value x and a bit value y based on information bits of the ith sub-block and an information bit length of the ith sub-block, where the bit value x and the bit value y cover the information bits of the ith sub-block; and determine the first P matrix based on the bit value x, and determine the first b vector based on the bit value y.

Optionally, an information bit length of the bit value x is less than or equal to the information bit length of the ith sub-block and is greater than 0, and an index value indicated by the bit value x does not exceed an index value corresponding to the P-matrix set; and an information bit length of the bit value y is less than or equal to the information bit length of the ith sub-block and is greater than 0, and an index value indicated by the bit value y does not exceed an index value corresponding to the b-vector set.

Optionally, the processing module 702 is specifically configured to determine the first P matrix from the P-matrix set based on the bit value x and a first index relationship, where the first index relationship is used to indicate a correspondence between an information bit of the ith sub-block and a P matrix in the P-matrix set.

Optionally, the processing module 702 is specifically configured to determine the first b vector from the b-vector set based on the bit value y and a second index relationship, where the second index relationship is used to indicate a correspondence between an information bit of the ith sub-block and a b vector in the b-vector set.

Optionally, the obtaining module 701 is specifically configured to receive first configuration information sent by the second communication apparatus, where the first configuration information carries M; or the obtaining module 701 is specifically configured to: receive second configuration information sent by the second communication apparatus, where the second configuration information carries time-frequency resource information of the ith sub-block; and determine M based on a quantity of available time-frequency resources indicated by the time-frequency resource information.

Optionally, the obtaining module 701 is specifically configured to: compare 2 to the power of N with the quantity of available time-frequency resources, and use N that minimizes the difference between the two as M. Optionally, the first communication apparatus 700 further includes a storage module. The storage module is coupled to the processing module, so that the processing module can execute computer executable instructions stored in the storage module, to implement functions of the terminal in the foregoing method embodiments. In an example, the storage module optionally included in the first communication apparatus 700 may be a storage unit in a chip, for example, a register or a cache. The storage module may alternatively be a storage unit located outside the chip, for example, a ROM, another type of static storage device that can store static information and instructions, or a RAM.

It should be understood that a procedure performed between the modules of the user equipment in the embodiment corresponding to FIG. 7 is similar to a procedure performed by the terminal in the corresponding method embodiments in FIG. 2 to FIG. 6. Details are not described herein again.

Figure 8:
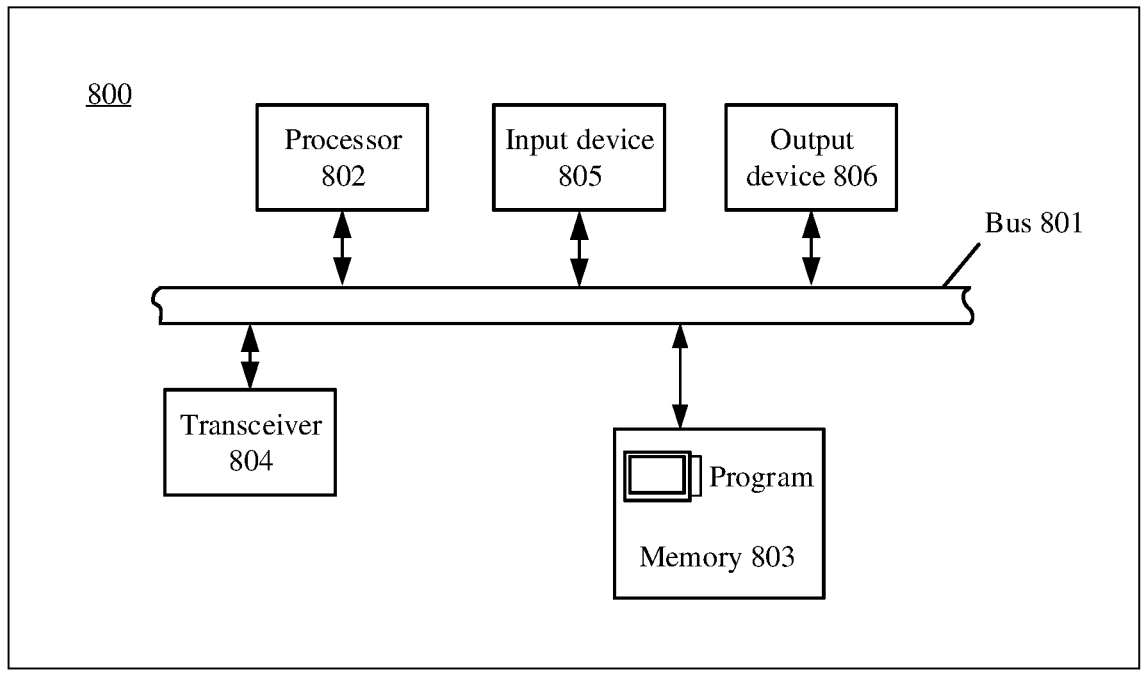
FIG. 8 is a schematic diagram of another embodiment of a first communication apparatus according to an embodiment of this application.

FIG. 8 is a schematic diagram of a possible structure of a first communication apparatus 800 in the foregoing embodiment. The first communication apparatus 800 may be configured as the foregoing user equipment. The first communication apparatus 800 may include a processor 802, a computer-readable storage medium/memory 803, a transceiver 804, an input device 805, an output device 806, and a bus 801. The processor, the transceiver, the computer-readable storage medium, and the like are connected by using a bus. A specific connection medium between the foregoing components is not limited in this embodiment of this application.

In an example, the transceiver 804 obtains information bit information of an ith sub-block, where i is a positive integer, and the information bit information of the ith sub-block includes information bits of the ith sub-block and an information bit length of the ith sub-block; and obtains a matrix order M, where M is a matrix order of an RM sequence corresponding to the first communication apparatus in the ith sub-block, and M is a positive integer.

The processor 802 determines a first P matrix and a first b vector based on M and the information bit information of the ith sub-block; and generates, based on the first P matrix and the first b vector, the RM sequence corresponding to the ith sub-block;

The transceiver 804 outputs the RM sequence corresponding to the ith sub-block.

In an example, the processor 802 may include a baseband circuit, for example, may perform modulation processing on data blocks, and generate an RM sequence. The transceiver 804 may include a radio frequency circuit, to perform processing such as modulation and amplification on the RM sequence, and then send the RM sequence to the second communication apparatus.

In another example, the processor 802 may run an operating system to control a function between each device and each component. The transceiver 804 may include a baseband circuit and a radio frequency circuit, for example, may process the RM sequence by using the baseband circuit and the radio frequency circuit, and then send the processed RM sequence to the second communication apparatus.

The transceiver 804 and the processor 802 may implement corresponding steps in any one of the embodiments in FIG. 2 to FIG. 6. Details are not described herein again.

It may be understood that FIG. 8 shows only a simplified design of the first communication apparatus. In actual application, the first communication apparatus may include any quantity of transceivers, processors, memories, and the like, and all first communication apparatuses that can implement this application fall within the protection scope of this application.

The processor 802 in the foregoing apparatus 800 may be a general purpose processor, for example, a CPU, a network processor (NP), or a microprocessor, or may be an ASIC, or one or more integrated circuits configured to control program execution in the solutions of this application. Alternatively, the processor 802 may be a digital signal processor (DSP), a field-programmable gate array (FPGA), another programmable logic device, a discrete gate, a transistor logic device, or a discrete hardware component. The controller/processor may also be a combination of processors implementing a computing function, for example, a combination of one or more microprocessors, or a combination of the DSP and a microprocessor. The processor usually performs logical and arithmetic operations based on program instructions stored in the memory.

The foregoing bus 801 may be a peripheral component interconnect (PCI) bus, an extended industry standard architecture (EISA) bus, or the like. The bus may be classified into an address bus, a data bus, a control bus, and the like. For ease of illustration, only one thick line is used to represent the bus in FIG. 8, but this does not mean that there is only one bus or only one type of bus.

The foregoing computer-readable storage medium/memory 803 may further store an operating system and other application programs. Specifically, the program may include program code, and the program code includes computer operation instructions. More specifically, the foregoing memory may be a ROM, a static storage device of another type that may store static information and instructions, a RAM, a dynamic storage device of another type that may store information and instructions, a magnetic disk memory, or the like. The memory 803 may be a combination of the foregoing storage types. In addition, the computer-readable storage medium/memory may be located in the processor, may be located outside the processor, or may be distributed in a plurality of entities including the processor or a processing circuit. The computer-readable storage medium/memory may be specifically embodied in a computer program product. For example, the computer program product may include a computer-readable medium in a packaging material.

Alternatively, an embodiment of this application further provides a universal processing system. For example, the universal processing system is usually referred to as a chip. The universal processing system includes one or more microprocessors that provide a processor function, and an external memory that provides at least a part of a storage medium. All these components are connected to another supporting circuit by using an external bus architecture. When the instructions stored in the memory are executed by the processor, the processor is enabled to perform some or all steps of the data transmission method of the first communication apparatus in the embodiments in FIG. 2 to FIG. 6, and/or another process of the technology described in this application.

Method or algorithm steps described in combination with the content disclosed in this application may be implemented by hardware, or may be implemented by a processor by executing software instructions. The software instructions may include a corresponding software module. The software module may be stored in a RAM, a flash memory, a ROM, an EPROM, an EEPROM, a register, a hard disk, a removable hard disk, a CD-ROM, or a storage medium in any other form well-known in the art. For example, a storage medium is coupled to a processor, so that the processor can read information from the storage medium and write information into the storage medium. Certainly, the storage medium may be a component of the processor. The processor and the storage medium may be disposed in an ASIC. In addition, the ASIC may be located in a terminal. Certainly, the processor and the storage medium may exist in the first communication apparatus as discrete components.

Figure 9:
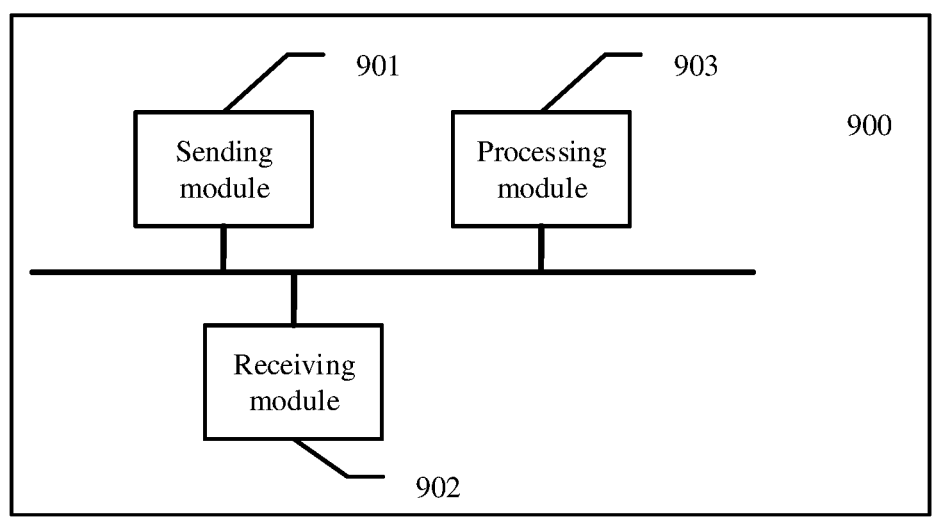
FIG. 9 is a schematic diagram of an embodiment of a second communication apparatus according to an embodiment of this application.

Specifically, referring to FIG. 9, the second communication apparatus 900 in this embodiment of this application includes a sending module 901, a receiving module 902, and a processing module 903. The sending module 901, the receiving module 902, and the processing module 903 are connected by using a bus. The second communication apparatus 900 may be the network device in the foregoing method embodiments, or may be one or more chips configured in the network device. The second communication apparatus 900 may be configured to perform some or all functions of the network device in the foregoing method embodiments.

For example, the sending module 901 may be configured to perform step 201, step 301, or step 401 in the foregoing method embodiments. For example, the sending module 901 sends configuration information to the first communication apparatus, where the configuration information is used to indicate a matrix order M, M is a matrix order of an RM sequence corresponding to the first communication apparatus in an ith sub-block, and M and i are positive integers.

The receiving module 902 may be configured to perform data receiving in step 206, step 306, or step 405 in the foregoing method embodiments. For example, the receiving module 902 receives the RM sequence that is corresponding to the ith sub-block and that is sent by the first communication apparatus.

The processing module 903 may be configured to perform step 207 to step 208, or step 307 to step 308, or step 406 to step 407 in the foregoing method embodiments. For example, the processing module 903 obtains a first P matrix and a first b vector based on the RM sequence corresponding to the ith sub-block; and obtains information bits of the ith sub-block based on the first P matrix and the first b vector.

Optionally, the processing module 903 is specifically configured to: obtain a bit value x based on the first P matrix, obtain a bit value y based on the first b vector, and obtain information bit information of the ith sub-block based on the bit value x, the bit value y, and a mapping rule.

Optionally, the processing module 903 is specifically configured to determine the bit value x based on the first P matrix and a first index relationship, where the first index relationship is used to indicate a correspondence between an information bit of the ith sub-block and a P matrix in the P-matrix set.

Optionally, the processing module 903 is specifically configured to determine the bit value y based on the first b vector and a second index relationship, where the second index relationship is used to indicate a correspondence between an information bit of the ith sub-block and a b vector in the b-vector set.

Optionally, the processing module 903 is further configured to parse the RM sequence corresponding to the ith sub-block to obtain the first P matrix and the first b vector.

Optionally, the configuration information carries M; or the configuration information carries time-frequency resource information of the ith sub-block, where the time-frequency resource information is used to indicate a quantity of available time-frequency resources.

Optionally, the second communication apparatus 900 further includes a storage module. The storage module may be configured to store program instructions and data that are necessary for the second communication apparatus. The storage module is coupled to the processing module, so that the processing module can execute the computer executable instructions stored in the storage module to implement the foregoing method embodiments. In an example, the storage module optionally included in the second communication apparatus 900 may be a storage unit in a chip, for example, a register or a cache. The storage module may alternatively be a storage unit located outside the chip, for example, a ROM, another type of static storage device that can store static information and instructions, or a RAM.

It should be understood that a procedure performed between the modules of the second communication apparatus in the embodiment corresponding to FIG. 9 is similar to a procedure performed by the second communication apparatus in the method embodiments corresponding to FIG. 2 to FIG. 6. Details are not described herein again.

Figure 10:
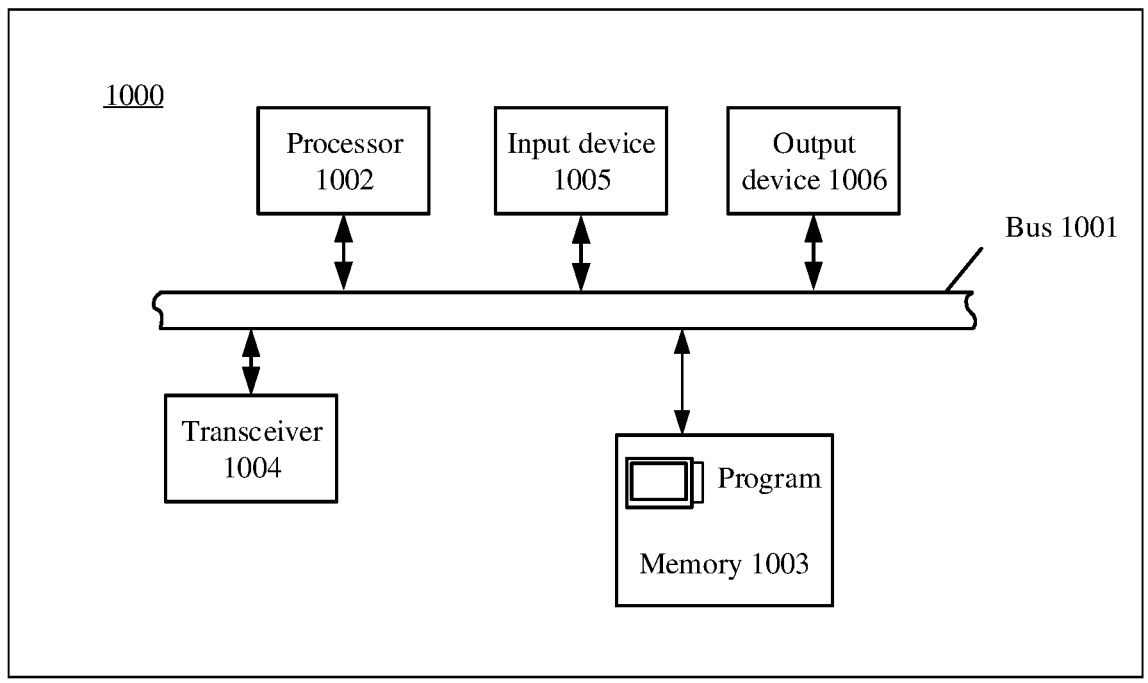
FIG. 10 is a schematic diagram of another embodiment of a second communication apparatus according to an embodiment of this application.

FIG. 10 is a schematic diagram of a possible structure of a second communication apparatus 1000 in the foregoing embodiment. The second communication apparatus 1000 may be configured as the foregoing network device. The second communication apparatus 1000 may include a processor 1002, a computer-readable storage medium/memory 1003, a transceiver 1004, an input device 1005, an output device 1006, and a bus 1001. The processor, the transceiver, the computer-readable storage medium, and the like are connected by using a bus. A specific connection medium between the foregoing components is not limited in this embodiment of this application.

In an example, the transceiver 1004 sends configuration information to the first communication apparatus, where the configuration information is used to indicate a matrix order M, M is a matrix order of an RM sequence corresponding to the first communication apparatus in an ith sub-block, and M and i are positive integers; and receives the RM sequence that is corresponding to the ith sub-block and that is sent by the first communication apparatus.

The processor 1002 obtains a first P matrix and a first b vector based on the RM sequence; and obtains information bits of the ith sub-block based on the first P matrix and the first b vector.

In an example, the processor 1002 may run an operating system to control a function between each device and each component. The transceiver 1004 may include a baseband circuit and a radio frequency circuit, for example, may process a data packet by using the baseband circuit and the radio frequency circuit, and then send the processed data packet to the second communication apparatus.

The transceiver 1004 and the processor 1002 may implement corresponding steps in any one of the embodiments in FIG. 2 to FIG. 6. Details are not described herein again.

It may be understood that FIG. 10 shows only a simplified design of the second communication apparatus. In actual application, the second communication apparatus may include any quantity of transceivers, processors, memories, and the like, and all second communication apparatuses that can implement this application fall within the protection scope of this application.

The processor 1002 in the second communication apparatus 1000 may be a general purpose processor, for example, a CPU, an NP, or a microprocessor, or may be an ASIC, or one or more integrated circuits configured to control program execution in the solutions of this application. Alternatively, the processor 1002 may be a DSP, an FPGA or another programmable logic device, a discrete gate, a transistor logic device, or a discrete hardware component. The controller/processor may also be a combination of processors implementing a computing function, for example, a combination of one or more microprocessors, or a combination of the DSP and a microprocessor. The processor usually performs logical and arithmetic operations based on program instructions stored in the memory.

The foregoing bus 1001 may be a PCI bus, an EISA bus, or the like. The bus may be classified into an address bus, a data bus, a control bus, and the like. For ease of illustration, only one thick line is used to represent the bus in FIG. 10, but this does not mean that there is only one bus or only one type of bus.

The foregoing computer-readable storage medium/memory 1003 may further store an operating system and other application programs. Specifically, the program may include program code, and the program code includes computer operation instructions. More specifically, the foregoing memory may be a ROM, a static storage device of another type that may store static information and instructions, a RAM, a dynamic storage device of another type that may store information and instructions, a magnetic disk memory, or the like. The memory 1003 may be a combination of the foregoing storage types. In addition, the computer-readable storage medium/memory may be located in the processor, may be located outside the processor, or may be distributed in a plurality of entities including the processor or a processing circuit. The computer-readable storage medium/memory may be specifically embodied in a computer program product. For example, the computer program product may include a computer-readable medium in a packaging material.

Alternatively, an embodiment of this application further provides a universal processing system. For example, the universal processing system is usually referred to as a chip. The universal processing system includes one or more microprocessors that provide a processor function, and an external memory that provides at least a part of a storage medium. All these components are connected to another supporting circuit by using an external bus architecture. When the instructions stored in the memory are executed by the processor, the processor is enabled to perform some or all steps of the data transmission methods in the embodiments of FIG. 2 to FIG. 6, and/or another process of the technology described in this application.

Method or algorithm steps described in combination with the content disclosed in this application may be implemented by hardware, or may be implemented by a processor by executing software instructions. The software instructions may include a corresponding software module. The software module may be stored in a RAM, a flash memory, a ROM, an EPROM, an EEPROM, a register, a hard disk, a removable hard disk, a CD-ROM, or a storage medium in any other form well-known in the art. For example, a storage medium is coupled to a processor, so that the processor can read information from the storage medium and write information into the storage medium. Certainly, the storage medium may be a component of the processor. The processor and the storage medium may be disposed in an ASIC. In addition, the ASIC may be located in a server. Certainly, the processor and the storage medium may exist in the second communication apparatus as discrete components.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiments are merely examples. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate components may or may not be physically separate, and components displayed as units may or may not be physical units, may be located in one location, or may be distributed on a plurality of network units. Some or all of the units may be selected based on actual requirements to achieve the objectives of the solutions of embodiments.

In addition, functional units in embodiments of this application may be integrated into one processing unit, or each of the units may exist alone physically, or two or more units are integrated into one unit. The integrated unit may be implemented in the form of hardware, or may be implemented in the form of a software functional unit.

When the integrated unit is implemented in the form of a software functional unit and sold or used as an independent product, the integrated unit may be stored in a computer-readable storage medium. Based on such an understanding, the technical solutions of this application essentially, or the part contributing to the prior art, or some of the technical solutions may be implemented in a form of a software product. The computer software product is stored in a storage medium and includes several instructions for instructing a computer device (which may be a personal computer, a server, a network device, or the like) to perform all or some of the steps of the methods described in embodiments of this application. The storage medium includes any medium that can store program code, such as a USB flash drive, a removable hard disk, a read-only memory (ROM), a random access memory (RAM), a magnetic disk, or an optical disc.

In conclusion, the foregoing embodiments are merely intended for describing the technical solutions of this application, but not for limiting this application. Although this application is described in detail with reference to the foregoing embodiments, a person of ordinary skill in the art should understand that modifications to the technical solutions recorded in the foregoing embodiments or equivalent replacements to some technical features thereof may still be made without departing from the spirit and scope of the technical solutions of embodiments of this application.

What is claimed is:

1. A data transmission method, comprising:
obtaining, by a first communication apparatus, information bit information of an ith sub-block, wherein i is a positive integer, and the information bit information of the ith sub-block comprises information bits of the ith sub-block and an information bit length of the ith sub-block;
obtaining, by the first communication apparatus, a matrix of order M, wherein M is a matrix order of a Reed-Muller (RM) sequence corresponding to the first communication apparatus in the ith sub-block, and M is a positive integer;
determining, by the first communication apparatus, a first P matrix and a first b vector based on M and the information bit information of the ith sub-block;
generating, by the first communication apparatus based on the first P matrix and the first b vector, the RM sequence corresponding to the ith sub-block; and
outputting, by the first communication apparatus, the RM sequence corresponding to the ith sub-block.

2. The method according to claim 1, wherein the determining, by the first communication apparatus, the first P matrix and the first b vector based on M and the information bit information of the ith sub-block comprises:
obtaining, by the first communication apparatus, a P-matrix set and a b-vector set based on M; and
determining, by the first communication apparatus, the first P matrix from the P-matrix set based on the information bit information of the ith sub-block; and
determining the first b vector from the b-vector set.

3. The method according to claim 2, wherein the obtaining, by the first communication apparatus, the P-matrix set and the b-vector set based on M comprises one of:
performing:
generating, by the first communication apparatus, a size of the P-matrix set and a size of the b-vector set based on M and the information bit length of the ith sub-block; and
generating, by the first communication apparatus, the P-matrix set and the b-vector set based on M, the size of the P-matrix set, the size of the b-vector set, and an information bit set, wherein the information bit set comprises information bits of at least one of the first sub-block to the ith sub-block; or
performing:
generating, by the first communication apparatus, a size of the P-matrix set and a size of the b-vector set based on M and a length of encoded information bits of the ith sub-block, wherein the length of the encoded information bits of the ith sub-block is a sum of a length of check bits after the check bits are added to the ith sub-block and the information bit length of the ith sub-block; and
generating, by the first communication apparatus, the P-matrix set and the b-vector set based on M, the size of the P-matrix set, the size of the b-vector set, and an information bit set.

4. The method according to claim 3, wherein the information bit set comprises information bits of at least one of the first sub-block to the ith sub-block; or
wherein the information bit set comprises at least one of the encoded information bits of the first sub-block to the encoded information bits of the ith sub-block, and wherein the encoded information bits comprise check bits and information bits of the sub-block.

5. The method according to claim 3, wherein one of:
the generating, by the first communication apparatus, a size of the P-matrix set and a size of the b-vector set based on M and the information bit length of the ith sub-block comprises:
determining, based on the information bit length of the ith sub-block being greater than or equal to M, the size of the P-matrix set based on the information bit length of the ith sub-block and M, and the size of the b-vector set is determined by M; or
determining, based on the information bit length of the ith sub-block being less than M, the size of the P-matrix set is 1, and the size of the b-vector set is determined by the information bit length of the ith sub-block; or
the generating, by the first communication apparatus, a size of the P-matrix set and a size of the b-vector set based on M and a length of encoded information bits of the ith sub-block comprises:
determining, based on the length of the encoded information bits of the ith sub-block being greater than or equal to M, the size of the P-matrix set based on the length of the encoded information bits of the ith sub-block and M, and the size of the b-vector set is determined by M; or
determining, based on the length of the encoded information bits of the ith sub-block being less than M, the size of the P-matrix set is 1, and the size of the b-vector set is determined by the length of the encoded information bits of the ith sub-block.

6. The method according to claim 3, wherein the generating, by the first communication apparatus, the P-matrix set and the b-vector set based on M, the size of the P-matrix set, the size of the b-vector set, and the information bit set comprises:
generating, by the first communication apparatus, elements of all P matrices in the P-matrix set based on M, the size of the P-matrix set, and the information bit set;
generating elements of all b vectors in the b-vector set based on M, the size of the b-vector set, and the information bit set;
generating, by the first communication apparatus, the P-matrix set according to a preset filling rule and elements of all P matrices in the P-matrix set; and
generating the b-vector set based on a length of the b vector and the elements of all b vectors in the b-vector set.

7. The method according to claim 2, wherein the obtaining, by the first communication apparatus, the P-matrix set and the b-vector set based on M comprises:
selecting, by the first communication apparatus, at least two P-matrix subsets and at least two b-vector subsets based on M, wherein the P-matrix set comprises the at least two P-matrix subsets, and the b-vector set comprises the at least two b-vector subsets.

8. The method according to claim 2, wherein the determining, by the first communication apparatus, the first P matrix from the P-matrix set based on the information bit information of the ith sub-block, and determining the first b vector from the b-vector set comprises:
obtaining, by the first communication apparatus, an index value of each P matrix in the P-matrix set and an index value of each b vector in the b-vector set;
selecting, by the first communication apparatus, a bit value x and a bit value y based on the information bits of the ith sub-block and the information bit length of the ith sub-block, wherein the bit value x and the bit value y cover the information bits of the ith sub-block; and
determining, by the first communication apparatus, the first P matrix based on the bit value x, and determining the first b vector based on the bit value y.

9. A data transmission method, comprising:
sending, by a second communication apparatus, configuration information to a first communication apparatus, wherein the configuration information indicates a matrix order M, M is a matrix order of a Reed-Muller (RM) sequence corresponding to the first communication apparatus in an ith sub-block, and M and i are positive integers;
receiving, by the second communication apparatus, the RM sequence that is corresponding to the ith sub-block and that is sent by the first communication apparatus;
obtaining, by the second communication apparatus, a first P matrix and a first b vector based on the RM sequence; and
obtaining, by the second communication apparatus, information bits of the ith sub-block based on the first P matrix and the first b vector.

10. The method according to claim 9, wherein the obtaining, by the second communication apparatus, the information bits of the ith sub-block based on the first P matrix and the first b vector comprises:
obtaining, by the second communication apparatus, a bit value x based on the first P matrix, and obtaining a bit value y based on the first b vector; and
obtaining, by the second communication apparatus, information bit information of the ith sub-block based on the bit value x, the bit value y, and a mapping rule.

11. The method according to claim 9, wherein the method further comprises, before the obtaining, by the second communication apparatus, information bits of the ith sub-block based on the first P matrix and the first b vector:
parsing, by the second communication apparatus, the RM sequence corresponding to the ith sub-block to obtain the first P matrix and the first b vector.

12. The method according to claim 9, wherein the configuration information carries M; or
the configuration information carries time-frequency resource information of the ith sub-block, and the time-frequency resource information indicates a quantity of available time-frequency resources.

13. A first communication apparatus, comprising:
a processor; and
a non-transitory computer-readable storage medium storing a program to be executed by the processor, the program including instructions to:
obtain information bit information of an ith sub-block, wherein i is a positive integer, and the information bit information of the ith sub-block comprises information bits of the ith sub-block and an information bit length of the ith sub-block;
obtain a matrix order M, wherein M is a matrix order of a Reed-Muller (RM) sequence corresponding to the first communication apparatus in the ith sub-block, and M is a positive integer;
determine a first P matrix and a first b vector based on M and the information bit information of the ith sub-block;
generate, based on the first P matrix and the first b vector, the RM sequence corresponding to the ith sub-block; and output the RM sequence corresponding to the ith sub-block.

14. The first communication apparatus according to claim 13, wherein the determining the first P matrix and the first b vector based on M and the information bit information of the ith sub-block comprises:
  obtaining P-matrix set and a b-vector set based on M; and
  determining the first P matrix from the P-matrix set based on the information bit information of the ith sub-block; and
  determining the first b vector from the b-vector set.

15. The first communication apparatus according to claim 14, wherein the obtaining the P-matrix set and the b-vector set based on M comprises:
  selecting at least two P-matrix subsets and at least two b-vector subsets based on M, wherein the P-matrix set comprises the at least two P-matrix subsets, and the b-vector set comprises the at least two b-vector subsets.

16. The first communication apparatus according to claim 14, wherein the determining the first P matrix from the P-matrix set based on the information bit information of the ith sub-block, and determining the first b vector from the b-vector set comprises:
  obtaining, by the first communication apparatus, an index value of each P matrix in the P-matrix set and an index value of each b vector in the b-vector set;
  selecting, by the first communication apparatus, a bit value x and a bit value y based on the information bits of the ith sub-block and the information bit length of the ith sub-block, wherein the bit value x and the bit value y cover the information bits of the ith sub-block; and
  determining, by the first communication apparatus, the first P matrix based on the bit value x, and determining the first b vector based on the bit value y.

17. The first communication apparatus according to claim 14, wherein the obtaining the P-matrix set and the b-vector set based on M comprises one of:
  performing:
    generating a size of the P-matrix set and a size of the b-vector set based on M and the information bit length of the ith sub-block; and
    generating the P-matrix set and the b-vector set based on M, the size of the P-matrix set, the size of the b-vector set, and an information bit set, wherein the information bit set comprises information bits of at least one of the first sub-block to the ith sub-block; or
  performing:
    generating a size of the P-matrix set and a size of the b-vector set based on M and a length of encoded information bits of the ith sub-block, wherein the length of the encoded information bits of the ith sub-block is a sum of a length of check bits after the check bits are added to the ith sub-block and the information bit length of the ith sub-block; and
    generating the P-matrix set and the b-vector set based on M, the size of the P-matrix set, the size of the b-vector set, and an information bit set.

18. The first communication apparatus according to claim 17, wherein the information bit set comprises information bits of at least one of the first sub-block to the ith sub-block; or
  the information bit set comprises at least one of the encoded information bits of the first sub-block to the encoded information bits of the ith sub-block, and the encoded information bits comprise check bits and information bits of the sub-block.

19. The first communication apparatus according to claim 17, wherein one of:
  the generating the size of the P-matrix set and the size of the b-vector set based on M and the information bit length of the ith sub-block comprises:
    determining, based on the information bit length of the ith sub-block being greater than or equal to M, the size of the P-matrix set based on the information bit length of the ith sub-block and M, and the size of the b-vector set is determined by M; or
    determining, based on the information bit length of the ith sub-block being less than M, the size of the P-matrix set is 1, and the size of the b-vector set is determined by the information bit length of the ith sub-block; or
  the generating the size of the P-matrix set and the size of the b-vector set based on M and the length of encoded information bits of the ith sub-block comprises:
    determining, based on the length of the encoded information bits of the ith sub-block being greater than or equal to M, the size of the P-matrix set based on the length of the encoded information bits of the ith sub-block and M, and the size of the b-vector set is determined by M; or
    determining, based on the length of the encoded information bits of the ith sub-block being less than M, the size of the P-matrix set is 1, and the size of the b-vector set is determined by the length of the encoded information bits of the ith sub-block.

20. The first communication apparatus according to claim 17, wherein the generating the P-matrix set and the b-vector set based on M, the size of the P-matrix set, the size of the b-vector set, and the information bit set comprises:
  generating elements of all P matrices in the P-matrix set based on M, the size of the P-matrix set, and the information bit set;
  generating elements of all b vectors in the b-vector set based on M, the size of the b-vector set, and the information bit set; and
  generating the P-matrix set according to a preset filling rule and elements of all P matrices in the P-matrix set; and
  generating the b-vector set based on a length of the b vector and the elements of all b vectors in the b-vector set.

* * * * *